United States Patent
Kimoto et al.

(10) Patent No.: US 6,762,937 B2
(45) Date of Patent: Jul. 13, 2004

(54) POWER MODULE

(75) Inventors: Nobuyoshi Kimoto, Hyogo (JP);
Takanobu Yoshida, Tokyo (JP); Naoki Yoshimatsu, Fukuoka (JP); Masuo Koga, Fukuoka (JP); Dai Nakajima, Tokyo (JP); Gourab Majumdar, Tokyo (JP); Masakazu Fukada, Tokyo (JP)

(73) Assignees: Mitsubishi Denki Kabushiki Kaisha, Tokyo (JP); Ryoden Semiconductor System Engineering Corporation, Itami (JP)

( * ) Notice: Subject to any disclaimer, the term of this patent is extended or adjusted under 35 U.S.C. 154(b) by 0 days.

(21) Appl. No.: 10/314,989

(22) Filed: Dec. 10, 2002

(65) Prior Publication Data

US 2003/0063442 A1 Apr. 3, 2003

Related U.S. Application Data

(62) Division of application No. 09/690,012, filed on Oct. 17, 2000, now Pat. No. 6,522,544.

(30) Foreign Application Priority Data

May 16, 2000 (JP) ........................................ 2000-143482

(51) Int. Cl.[7] ................................................. H05K 7/20
(52) U.S. Cl. ..................... 361/699; 176/16.3; 165/80.4; 165/185; 257/728; 257/691; 257/696; 257/724; 257/642; 257/693; 361/704; 361/707; 361/710; 361/715; 361/763; 361/734

(58) Field of Search .............................. 174/16.3, 52.4, 174/252; 165/80.2–80.4, 185; 257/706–707, 712–713, 723–724, 728, 691–693, 696; 361/698–699, 704–722, 732, 734, 760, 763; 363/141, 144

(56) References Cited

U.S. PATENT DOCUMENTS

| | | | | |
|---|---|---|---|---|
| 4,965,710 A | * | 10/1990 | Pelly et al. | .................. 361/707 |
| 5,497,289 A | * | 3/1996 | Sugishima et al. | .......... 361/709 |
| 5,646,445 A | * | 7/1997 | Masumoto et al. | .......... 257/723 |
| 5,966,291 A | * | 10/1999 | Baumel et al. | .............. 361/707 |
| 6,166,937 A | * | 12/2000 | Yamamura et al. | .......... 363/141 |

* cited by examiner

Primary Examiner—Gregory D. Thompson
(74) Attorney, Agent, or Firm—Oblon, Spivak, McClelland, Maier & Neustadt, P.C.

(57) ABSTRACT

A power module includes a substrate with a power semiconductor device mounted thereon, a case having an interior in which the substrate is disposed, a cooling fin having a surface on which the substrate and the case are placed, and a smoothing capacitor disposed on an opposite surface of the cooling fin from the surface on which the substrate is placed, the smoothing capacitor being electrically connected to the power semiconductor device for smoothing a voltage to be externally supplied to the power semiconductor device.

2 Claims, 22 Drawing Sheets

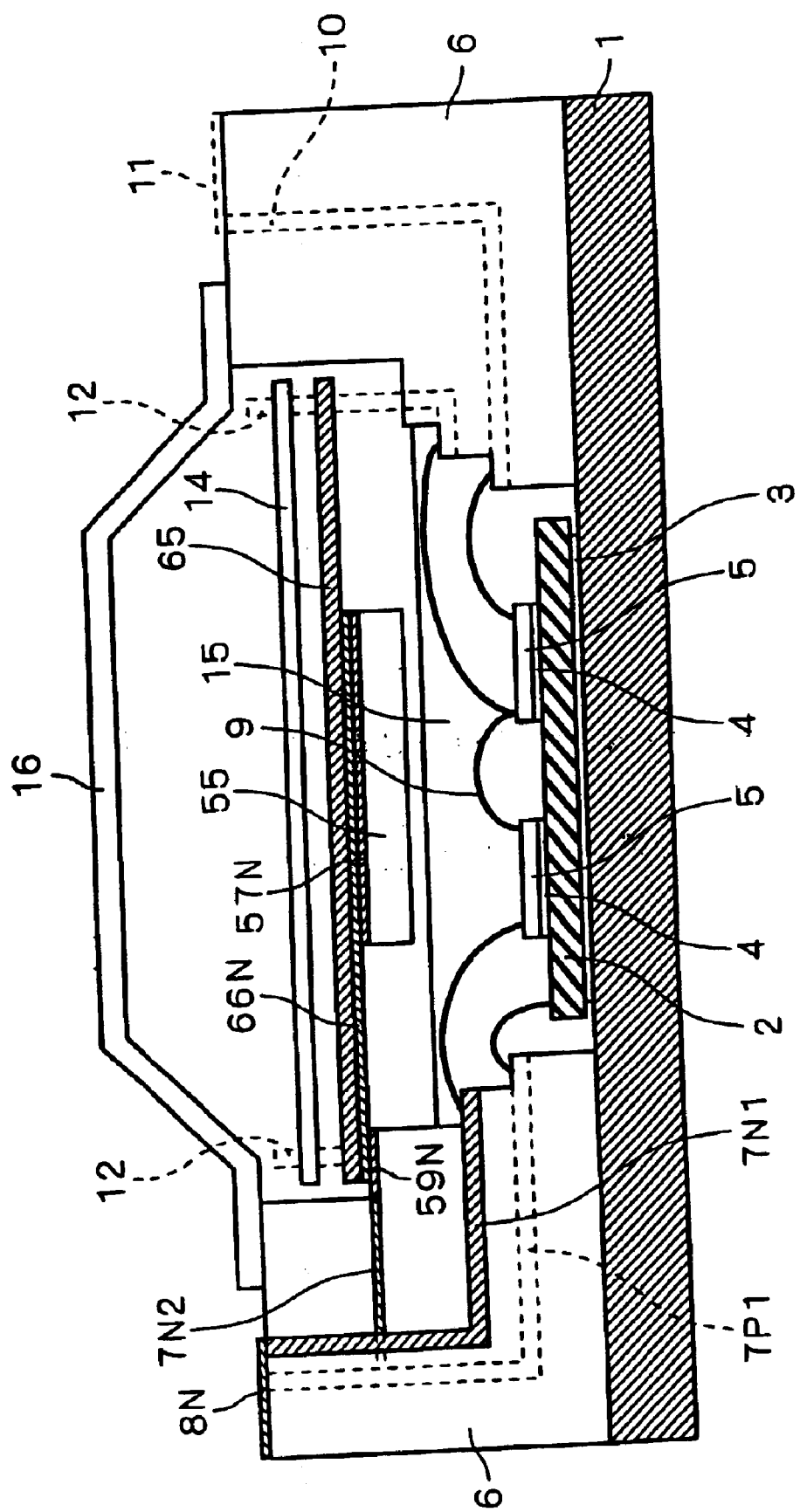
F I G. 22

F I G . 2 8   PRIOR ART
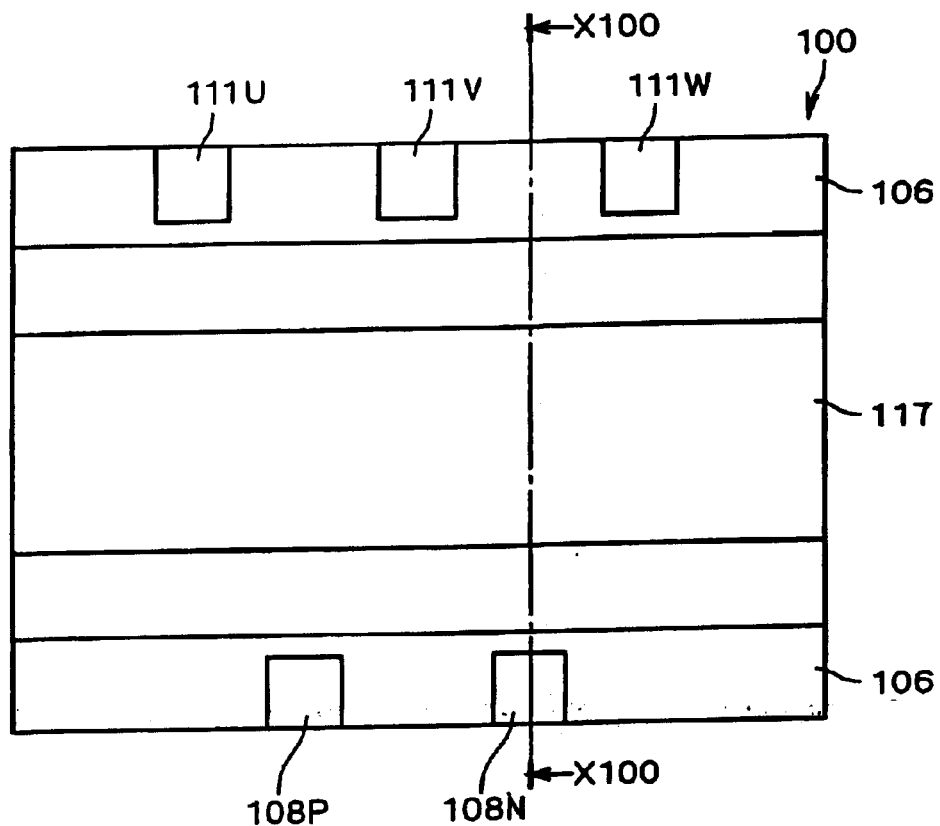
F I G . 2 9   PRIOR ART
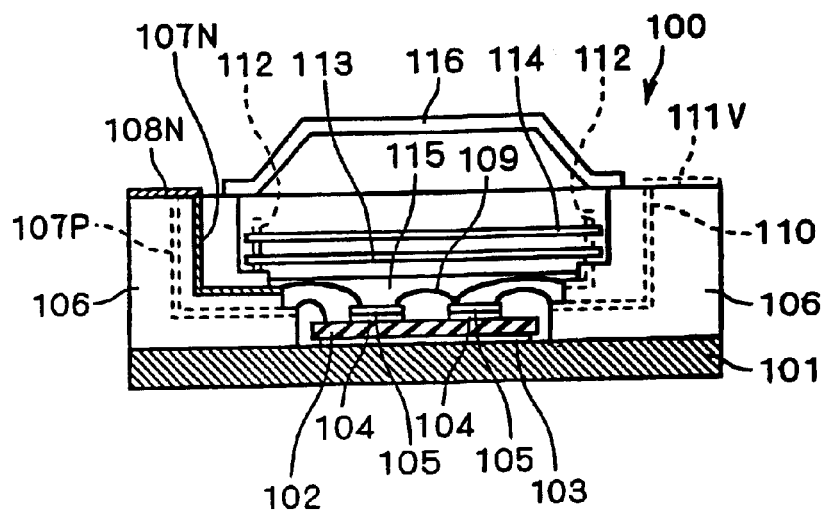

POWER MODULE

CROSS-REFERENCE TO RELATED APPLICATION

This application is a divisional of U.S. application Ser. No. 09/690,012, filed Oct. 17. 2000 now U.S. Pat. No. 6,522,544, the entire contents of which are incorporated herein by reference.

BACKGROUND OF THE INVENTION

1. Field of the Invention

The present invention relates to a power module structure and, more particularly, to a power module structure including a smoothing capacitor for smoothing a DC supply voltage to be externally applied to a power semiconductor device such as an IGBT.

2. Description of the Background Art

FIG. 28 is a schematic top plan view of a structure of a background art power module body portion 100. Output terminals 111U, 111V and 111W are arranged along a first side of a top surface of a case frame 106, and a P-terminal 108P and an N-terminal 108N are arranged along a second side of the top surface of the case frame 106 which is parallel to the first side.

FIG. 29 is a cross-sectional view showing a cross-sectional structure taken along the line X100—X100 of FIG. 28. The case frame 106 made of resin is disposed on a base plate 101 made of metal. A case lid 116 made of resin is disposed on the case frame 106. An insulating substrate 102 made of ceramic is soldered, as shown at 103, onto the base plate 101. A plurality of power semiconductor devices 105 such as IGBTs are soldered, as shown at 104, onto the insulating substrate 102. Circuit elements (not shown) such as switching elements are mounted on the top surface of the insulating substrate 102, and a predetermined circuit pattern (not shown) is formed on the top surface of the insulating substrate 102.

A control substrate 114 formed with a control circuit for controlling the power semiconductor devices 105 is disposed within the case frame 106. The control substrate 114 is soldered to first ends of respective interconnection electrodes 112. Second ends of the respective interconnection electrodes 112 are connected through aluminum wires 109 to the power semiconductor devices 105. An anti-noise shield plate 113 is disposed between the control substrate 114 and the insulating substrate 102 within the case frame 106. An interior space of the case frame 106 below the shield plate 113 is filled with a silicone gel 115.

The N-terminal 108N is disposed on the top surface of the case frame 106. The N-terminal 108N is connected to a first end of an N-electrode 107N. A second end of the N-electrode 107N is connected through the aluminum wires 109 to the power semiconductor devices 105. The P-terminal 108P (not shown in FIG. 29) is also disposed on the top surface of the case frame 106. The P-terminal 108P is connected to a first end of a P-electrode 107P. A second end of the P-electrode 107P is connected to the power semiconductor devices 105 through the aluminum wires 109 and the circuit pattern formed on the insulating substrate 102. The output terminal 111V is disposed on the top surface of the case frame 106. The output terminal 111V is connected to a first end of an output electrode 110. A second end of the output electrode 110 is connected through the aluminum wires 109 to the power semiconductor devices 105.

FIG. 30 is a schematic cross-sectional view showing the overall construction of a background power module, as viewed in side elevation. A smoothing capacitor 120 for smoothing a DC supply voltage to be externally applied to the power semiconductor devices 150 is disposed over the power module body portion 100. An N-electrode 121N and a P-electrode 121P (both designated by the reference numeral 121 in FIG. 30) of the smoothing capacitor 120, and the N-terminal 108N and the P-terminal 108P (both designated by the reference numeral 108 in FIG. 30) of the power module body portion 100 are connected to each other through a connecting conductor 124. The connecting conductor 124 has conductor plates 122N and 122P opposed to each other, with an insulation plate 123 there between. The conductor plates 122N, 122P and the N- and P-terminals 108N, 108P are fastened to each other with respective screws 125.

FIG. 31 is a schematic cross-sectional view showing a structure of connections between the smoothing capacitors 120 and the connecting conductor 124, as viewed in top plan. The conductor plate 122N is in contact with the N-electrodes 121N, and the conductor plate 122P is in contact with the P-electrodes 121P. The conductor plate 122N has openings 126 provided partially to avoid contact with the P-electrodes 121P, and the conductor plate 122P has openings 127 provided partially to avoid contact with the N-electrodes 121N.

However, the above-mentioned background art power module requires the connecting conductor 124 including the conductor plates 122N, 122P and the insulation plate 123 for connection between the N- and P-electrodes 121N, 121P of the smoothing capacitors 120 and the N- and P-terminals 108N, 108P of the power module body portion 100. This presents problems in the large number of parts and in complicated assembly.

Another problem is an increased circuit inductance because of a long wiring path between the smoothing capacitors 120 and the power semiconductor devices 105. In the operation of the power module, the high-speed switching of the power semiconductor devices 105 causes a large pulse-shaped current proportional to the amount of current change (di/dt) to flow between the smoothing capacitors 120 and the power semiconductor devices 105, thereby to develop a voltage proportional to the circuit inductance, which in turn is applied as noise to the power semiconductor devices 105. Further, the increase in circuit inductance requires the increase in electrostatic capacitance of the smoothing capacitors 120 for suppression of ripple voltage. This results in the increase in the size of the smoothing capacitors 120 and accordingly the increase in the size of the power module itself. Therefore, the circuit inductance is preferably low.

Furthermore, the background art power module which comprises the large-sized smoothing capacitors 120 disposed over the power module body portion 100 is too low in resistance to vibration for use as a vehicle-mounted power module, for example.

SUMMARY OF THE INVENTION

According to a first aspect of the present invention, a power module comprises: a substrate with a power semiconductor device mounted thereon; a case having an interior in which the substrate is disposed; an N-terminal and a P-terminal arranged along a first side of a main surface of the case and electrically connected to the power semiconductor device; and a smoothing capacitor having a first electrode connected to the N-terminal and a second electrode connected to the P-terminal for smoothing a voltage to be externally supplied to the power semiconductor device, wherein the smoothing capacitor has a main surface level with the main surface of the case, and is disposed in contact with a side surface of the case including the first side of the main surface of the case, and wherein the first electrode and the second electrode are disposed on the main surface of the smoothing capacitor and in proximity to the N-terminal and the P-terminal, respectively.

Preferably, according to a second aspect of the present invention, in the power module of the first aspect, the smoothing capacitor comprises: an enclosure; a plurality of capacitor elements disposed in the enclosure, each of the plurality of capacitor elements having a first electrode abutting against the first electrode of the smoothing capacitor and a second electrode abutting against the second electrode of the smoothing capacitor; and a hold-down plate for pressing the plurality of capacitor elements against the enclosure to fix the plurality of capacitor elements in the enclosure.

Preferably, according to a third aspect of the present invention, in the power module of the second aspect, the enclosure has a single heat sink for dissipating heat generated by the plurality of capacitor elements.

Preferably, according to a fourth aspect of the present invention, in the power module of the second or third aspect, at least one of the first and second electrodes of the smoothing capacitor has elasticity.

According to a fifth aspect of the present invention, a power module comprises: a substrate with a power semiconductor device mounted thereon; a case having an interior in which the substrate is disposed, the case including a predetermined recess in an outer surface thereof; an N-terminal and a P-terminal disposed on side walls of the recess and electrically connected to the power semiconductor device; and a smoothing capacitor fitted in the recess and having a first electrode positioned to correspond to the N-terminal and a second electrode positioned to correspond to the P-terminal for smoothing a voltage to be externally supplied to the power semiconductor device.

Preferably, according to a sixth aspect of the present invention, in the power module of the fifth aspect, there is provided at least one of a first electrically conductive elastic member between the first electrode and the N-terminal and a second electrically conductive elastic member between the second electrode and the P-terminal.

According to a seventh aspect of the present invention, a power module comprises: a first substrate with a power semiconductor device mounted thereon; a second substrate with a control circuit for controlling the power semiconductor device formed thereon; a smoothing capacitor electrically connected to the power semiconductor device for smoothing a voltage to be externally supplied to the power semiconductor device; and a case including a case frame and a case lid, the case having an interior in which the first substrate, the second substrate and the smoothing capacitor are disposed.

Preferably, according to an eighth aspect of the present invention, in the power module of the seventh aspect, the smoothing capacitor is disposed on the case lid.

Preferably, according to a ninth aspect of the present invention, the power module of the seventh aspect further comprises a shield plate disposed between the first substrate and the second substrate and fixed to the case frame, wherein the smoothing capacitor is disposed on the shield plate.

Preferably, according to a tenth aspect of the present invention, the power module of the ninth aspect further comprises a thermally conductive sheet formed between the shield plate and the smoothing capacitor.

Preferably, according to an eleventh aspect of the present invention, in the power module of the ninth aspect, the shield plate is a metal shield plate.

Preferably, according to a twelfth aspect of the present invention, in the power module of the seventh aspect, the smoothing capacitor is disposed on the first substrate.

Preferably, according to a thirteenth aspect of the present invention, in the power module of the twelfth aspect, the first substrate and the smoothing capacitor are made of the same material.

Preferably, according to a fourteenth aspect of the present invention, the power module of the seventh aspect further comprises a heat sink for dissipating heat generated from the first substrate, the first substrate and the case frame being placed on the heat sink, wherein the smoothing capacitor is disposed on the heat sink.

According to a fifteenth aspect of the present invention, a power module comprises: a substrate with a power semiconductor device mounted thereon; a case having an interior in which the substrate is disposed; a cooling fin having a surface on which the substrate and the case are placed; and a smoothing capacitor disposed on an opposite surface of the cooling fin from the surface on which the substrate is placed, the smoothing capacitor being electrically connected to the power semiconductor device for smoothing a voltage to be externally supplied to the power semiconductor device.

Preferably, according to a sixteenth aspect of the present invention, in the power module of any one of the first to fifteenth aspects, the smoothing capacitor is a ceramic capacitor.

The power module according to the first aspect of the present invention can shorten the wiring path between the smoothing capacitor and the power semiconductor device to reduce a circuit inductance. The contacting relationship between a side surface of the smoothing capacitor and the side surface of the case increases resistance to vibration.

In the power module according to the second aspect of the present invention, the hold-down plate collectively fixes the plurality of capacitor elements in the enclosure. This facilitates the step of mounting the plurality of capacitor elements.

The power module according to the third aspect of the present invention enhances the uniformity of the effect of cooling the plurality of capacitor elements.

The power module according to the fourth aspect of the present invention can prevent breakage of the capacitor elements resulting from the pressing force of the hold-down plate or the thermal stress associated with heat generated by the capacitor elements. Additionally, the power module according to the fourth aspect of the present invention can ensure the contact between the first electrode of the smoothing capacitor and the first electrodes of the respective capacitor elements and between the second electrode of the smoothing capacitor and the second electrodes of the respective capacitor elements.

The power module according to the fifth aspect of the present invention can shorten the wiring path between the smoothing capacitor and the power semiconductor device to reduce the circuit inductance. The provision of the smoothing capacitor fitted in the recess of the case reduces the size of the power module.

The power module according to the sixth aspect of the present invention can prevent breakage of the smoothing capacitor resulting from the pressing force exerted when the smoothing capacitor is inserted into the recess or the thermal stress associated with the heat generated by the smoothing capacitor. Additionally, the power module according to the sixth aspect of the present invention can ensure the contact between the N-terminal and the first electrode of the smoothing capacitor and between the P-terminal and the second electrode of the smoothing capacitor.

The power module according to the seventh aspect of the present invention can improve environmental resistance since the smoothing capacitor is isolated from an environment external to the case.

The power module according to the eighth aspect of the present invention can dissipate the heat generated by the smoothing capacitor through the case lid to the outside.

The power module according to the ninth aspect of the present invention has a shorter wiring path between the smoothing capacitor and the power semiconductor device than that of the power module according to the eighth aspect, to further reduce the circuit inductance.

The power module according to the tenth aspect of the present invention can effectively dissipate the heat generated by the smoothing capacitor through the thermally conductive sheet and the case frame to the outside, and alleviate the stress associated with the heat generated by the smoothing capacitor.

The power module according to the eleventh aspect of the present invention can effectively dissipate the heat generated by the smoothing capacitor through the shield plate and the case frame to the outside.

The power module according to the twelfth aspect of the present invention can significantly shorten the wiring path between the smoothing capacitor and the power semiconductor device to greatly reduce the circuit inductance.

The power module according to the thirteenth aspect of the present invention can make the smoothing capacitor and the insulating substrate equal in thermal expansion coefficient, to avoid various disadvantages resulting from the difference in thermal expansion coefficient, thereby enhancing the reliability of the power module.

The power module according to the fourteenth aspect of the present invention can effectively dissipate the heat generated by the smoothing capacitor through the heat sink to the outside.

In the power module according to the fifteenth aspect of the present invention, the cooling fin can effectively cool down the smoothing capacitor to enhance the reliability of the power module.

In the power module according to the sixteenth aspect of the present invention, the use of the ceramic capacitor having good charging and discharging properties increases the operating speed of the power module.

It is therefore an object of the present invention to provide a power module which can reduce a circuit inductance and which is small in size, light in weight and high in resistance to vibration.

These and other objects, features, aspects and advantages of the present invention will become more apparent from the following detailed description of the present invention when taken in conjunction with the accompanying drawings.

BRIEF DESCRIPTION OF THE DRAWINGS

FIG. 22 is a cross-sectional view showing a cross-sectional structure of a portion of the power module in which the N-terminal is disposed according to an eighth preferred embodiment of the present invention;

FIG. 28 is a top plan view schematically showing a structure of a background art power module body portion;

FIG. 29 is a cross-sectional view showing a cross-sectional structure taken along the line X100—X100 of FIG. 28;

DESCRIPTION OF THE PREFERRED EMBODIMENTS

First Preferred Embodiment

Figure 1:
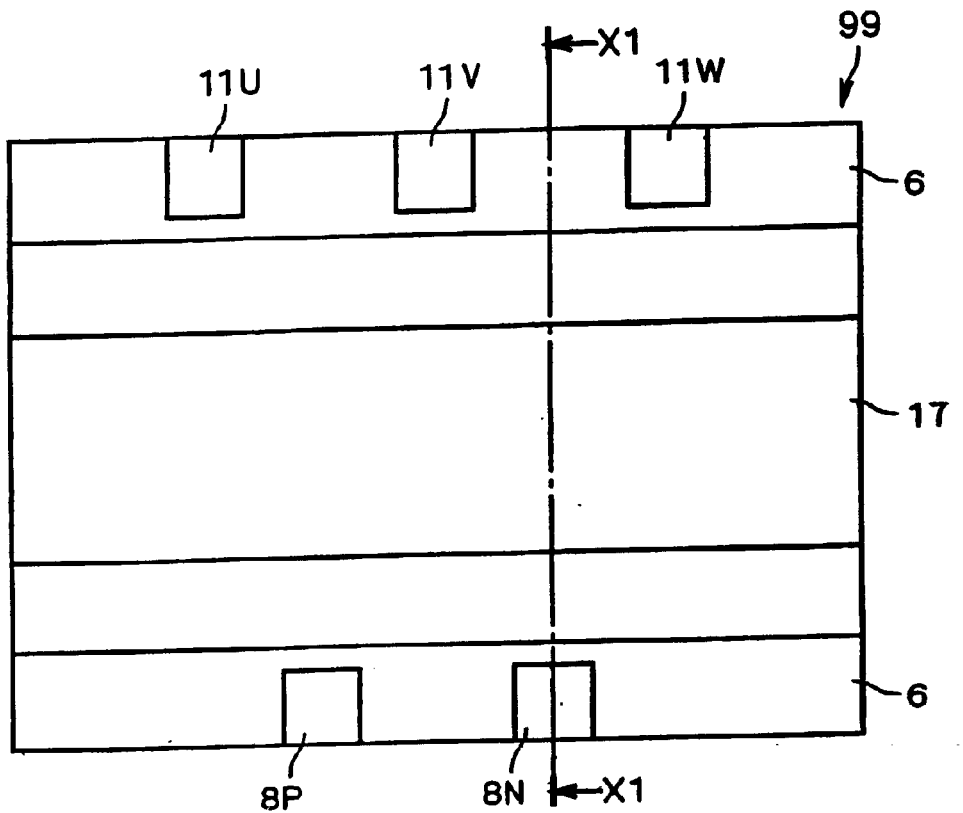
FIG. 1 is a top plan view schematically showing a structure of a power module body portion according to a first preferred embodiment of the present invention.

FIG. 1 is a top plan view schematically showing a structure of a power module body portion 99 according to a first preferred embodiment of the present invention. Output terminals 11U, 11V and 11W corresponding to three U-, V- and W-phases respectively are arranged along a first side of a top surface of a case frame 6. An N-terminal 8N and a P-terminal 8P are arranged along a second side of the top surface of the case frame 6 which is parallel to the first side.

Figure 2:
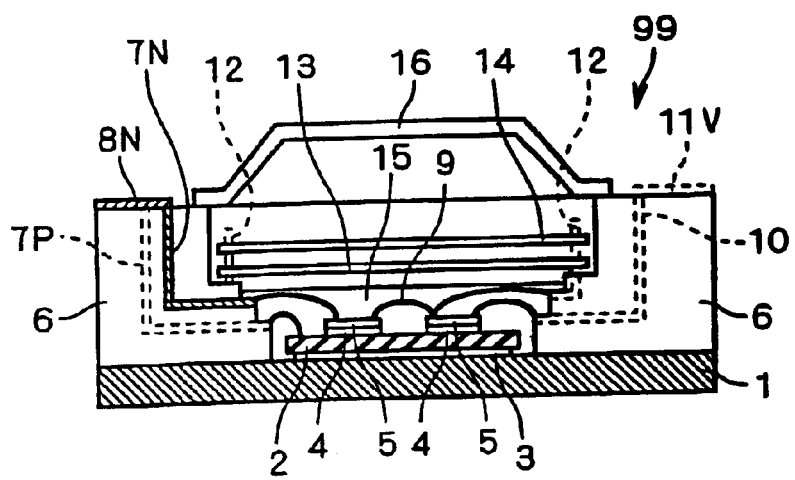
FIG. 2 is a cross-sectional view showing a cross-sectional structure taken along the line X1—X1 of FIG. 1.

FIG. 2 is a cross-sectional view showing a cross-sectional structure taken along the line X1—X1 of FIG. 1. The case frame 6 made of resin is disposed on a metal base plate 1 functioning as a heat sink, and a case lid 16 made of resin is disposed on the case frame 6. An insulating substrate 2 made of ceramic is soldered, as shown at 3, onto the base plate 1. A plurality of power semiconductor devices 5 such as IGBTs are mounted on the insulating substrate 2 with solder 4. Circuit elements (not shown) such as switching elements (IGBTs) are mounted on a top surface of the insulating substrate 2, and a predetermined circuit pattern (not shown) is formed on the top surface of the insulating substrate 2.

A control substrate 14 formed with a control circuit for controlling the power semiconductor devices 5 is disposed within the case frame 6. The control substrate 14 is soldered to first ends of respective interconnection electrodes 12. Second ends of the respective interconnection electrodes 12 are connected through aluminum wires 9 to the power semiconductor devices 5. An anti-noise shield plate 13 is disposed between the control substrate 14 and the insulating substrate 2 within the case frame 6. An interior space of the case frame 6 below the shield plate 13 is filled with a silicone gel 15.

The N-terminal 8N is disposed on the top surface of the case frame 6. The N-terminal 8N is connected to a first end of an N-electrode 7N buried in the case frame 6. A second end of the N-electrode 7N is connected through the aluminum wires 9 to the power semiconductor devices 5. The P-terminal 8P (not shown in FIG. 2) is also disposed on the top surface of the case frame 6. The P-terminal 8P is connected to a first end of a P-electrode 7P buried in the case frame 6. A second end of the P-electrode 7P is connected to the power semiconductor devices 5 through the aluminum wires 9 and the circuit pattern formed on the insulating substrate 2.

The output terminal 11V is disposed on the top surface of the case frame 6. The output terminal 11V is connected to a first end of an output electrode 10 buried in the case frame 6. A second end of the output electrode 10 is connected through the aluminum wires 9 to the power semiconductor devices 5. Like the output terminal 11V, the output terminals 11U and 11W, although not shown in FIG. 2, are connected through the output electrode 10 and the aluminum wires 9 to the power semiconductor devices 5.

Figure 3:
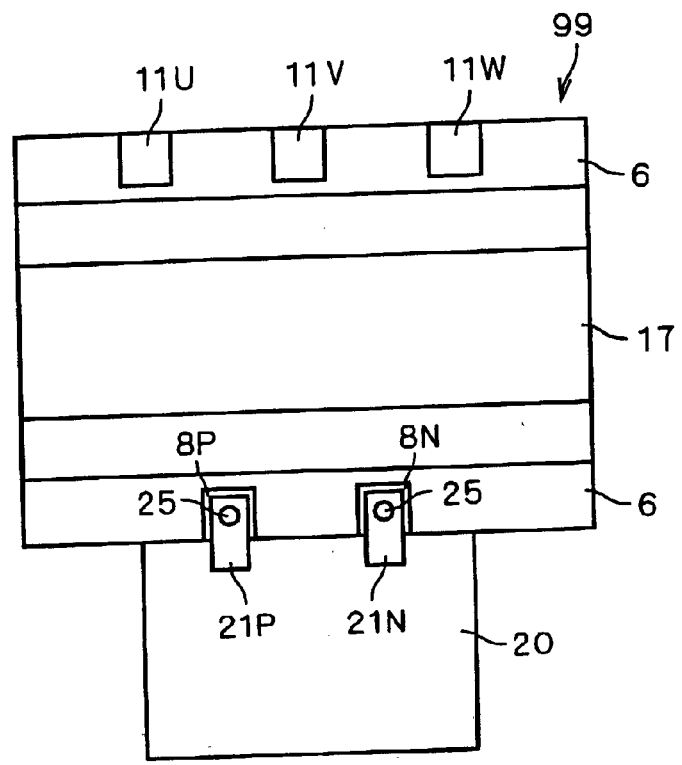
FIG. 3 is a top plan view schematically showing the overall construction of a power module according to the first preferred embodiment of the present invention.
Figure 4:
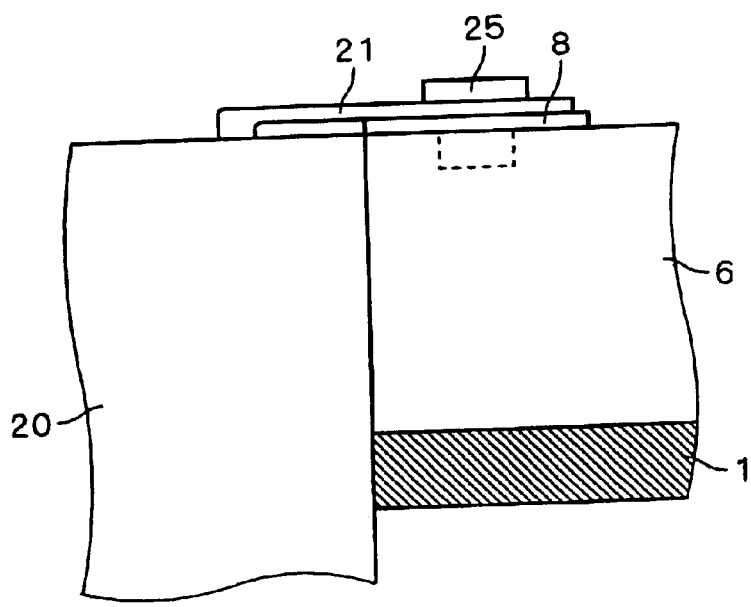
FIG. 4 is a cross-sectional view, on an enlarged scale, of a connection between the power module body portion and a smoothing capacitor shown in FIG. 3.

FIG. 3 is a top plan view schematically showing the overall construction of a power module according to the first preferred embodiment. FIG. 4 is a cross-sectional view, on an enlarged scale, of a connection between the power module body portion 99 shown in FIG. 3 and a smoothing capacitor 20. The box-shaped smoothing capacitor 20 for smoothing a DC supply voltage to be externally applied to the power semiconductor devices 5 is disposed in contact with a side surface of the case frame 6 including the second side (along which the N-terminal 8N and the P-terminal 8P are arranged) of the top surface of the case frame 6, with a top surface of the smoothing capacitor 20 leveled with the top surface of the case frame 6.

The smoothing capacitor 20 has an N-electrode 21N and a P-electrode 21P disposed on the top surface of the smoothing capacitor 20 and in proximity to the N-terminal 8N and the P-terminal 8P, respectively, of the power module body portion 99. Referring to FIG. 4, the N-electrode 21N and the P-electrode 21P (both designated by the reference numeral 21 in FIG. 4) are plate-like electrodes projecting from the top surface of the smoothing capacitor 20. The N-electrode 21N and the P-electrode 21P are bent toward the case frame 6, and are overlaid on the N-terminal 8N and the P-terminal 8P (both designated by the reference numeral 8 in FIG. 4), respectively. Then, screws 25 are used to fasten the N-electrode 21N and the N-terminal 8N to each other and to fasten the P-electrode 21P and the P-terminal 8P to each other. This establishes direct connection between the N- and P-electrodes 21N, 21P of the smoothing capacitor 20 and the N- and P-terminals 8N, 8P of the power module body portion 99, without the use of other connecting means such as a connecting cable.

In the power module according to the first preferred embodiment, as described above, the smoothing capacitor 20 is disposed in contact with the side surface of the case frame 6 and has the top surface level with the top surface of the case frame 6. The N-electrode 21N and the P-electrode 21P of the smoothing capacitor 20 are disposed in proximity to the N-terminal 8N and the P-terminal 8P of the power module body portion 99, respectively. This allows the direct connection to be established between the N-electrode 21N and the N-terminal 8N and between the P-electrode 21P and the P-terminal 8P, without the use of the background art connecting conductor 124. Consequently, the power module according to the first preferred embodiment can reduce the number of parts and shorten the wiring path between the smoothing capacitor 20 and the power semiconductor devices 5, thereby reducing a circuit inductance.

Additionally, the contacting relationship between the side surface of the smoothing capacitor 20 and the side surface of the power module body portion 99 increases resistance to vibration.

Figure 5:
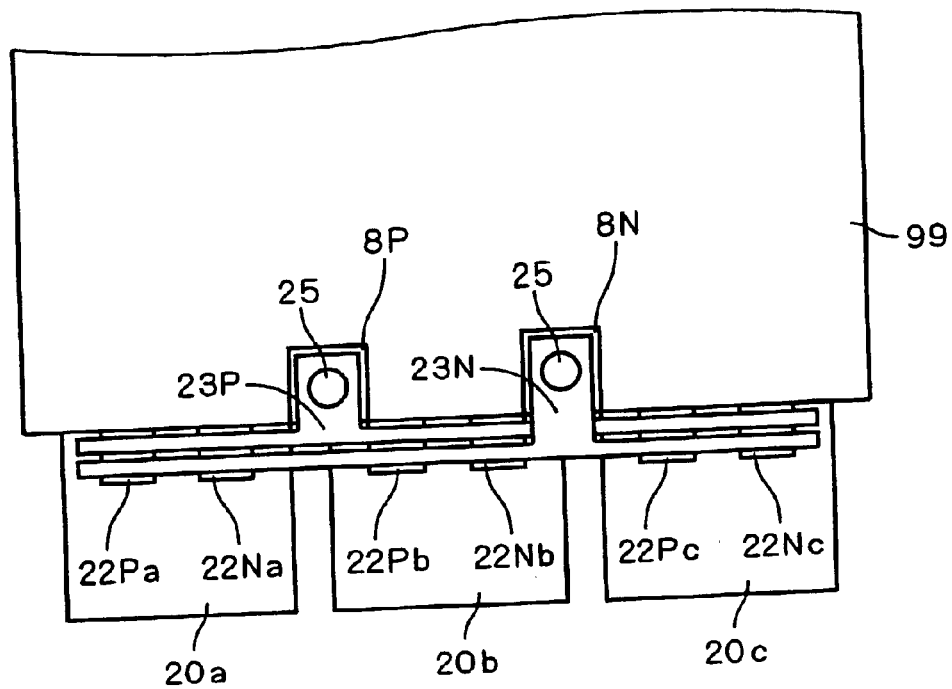
FIGS. 5 and 6 are top plan views schematically showing constructions of the power module having three smoothing capacitors.
Figure 6:
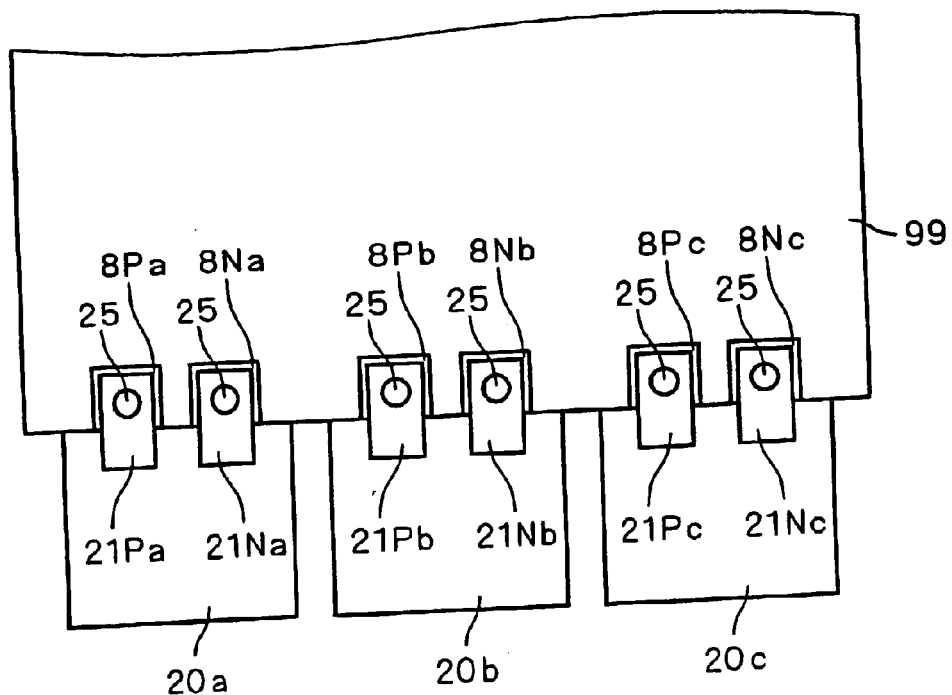

Although the single smoothing capacitor 20 is illustrated as disposed, a plurality of smoothing capacitors may be disposed. For example, three smoothing capacitors may be provided in corresponding relation to the three U-, V- and W-phases. FIGS. 5 and 6 are top plan views schematically showing the constructions of the power module comprising three smoothing capacitors 20a to 20c.

Referring to FIG. 5, the smoothing capacitors 20a to 20c have respective pad-shaped N-electrodes 22Na to 22Nc commonly connected to the N-terminal 8N of the power module body portion 99 through a connecting conductor 23N. The connecting conductor 23N is insulated from P-electrodes 22Pa to 22Pc. The P-electrodes 22Pa to 22Pc of the respective smoothing capacitors 20a to 20c are pad-shaped electrodes commonly connected to the P-terminal 8P of the power module body portion 99 through a connecting conductor 23P. The connecting conductor 23P is insulated from the connecting conductor 23N and the N-electrodes 22Na to 22Nc.

Referring to FIG. 6, the smoothing capacitors 20a to 20c have N-electrodes 21Na to 21Nc directly connected to N-terminals 8Na to 8Nc of the power module body portion 99, respectively. The smoothing capacitors 20a to 20c further have P-electrodes 21Pa to 21Pc directly connected to P-terminals 8Pa to 8Pc of the power module body portion 99, respectively.

The power modules shown in FIGS. 5 and 6 comprises the separate smoothing capacitors 20a to 20c corresponding to the three respective phases. If a failure occurs in any one of the smoothing capacitors 20a to 20c, only the failed smoothing capacitor should be repaired or replaced. This contributes to cost reduction Further, the power module shown in FIG. 6, in which the smoothing capacitors 20a to 20c may be disposed at the shortest and equal distance from the three phases, reduces the imbalance between the phases and further reduces the circuit inductance.

Second Preferred Embodiment

Figure 7:
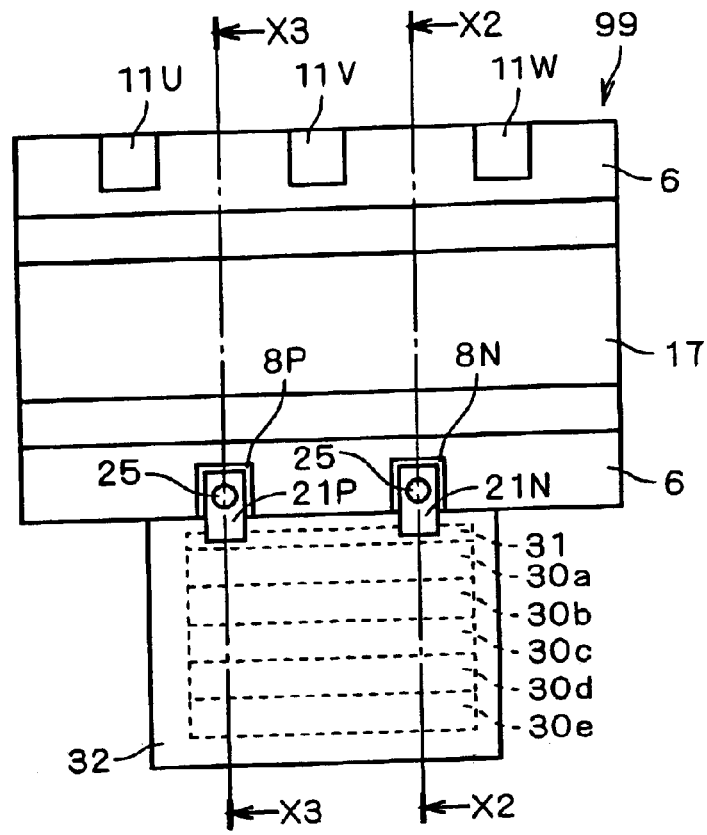
FIG. 7 is a top plan view schematically showing the overall construction of the power module according to a second preferred embodiment of the present invention.
Figure 8:
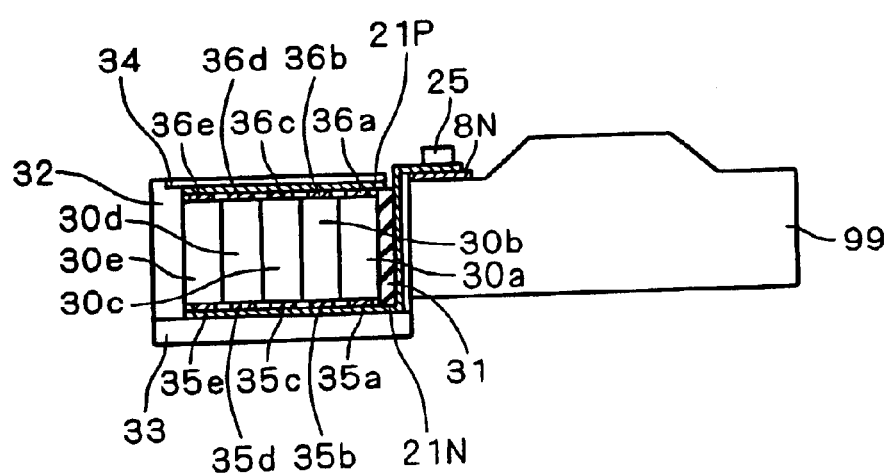
FIG. 8 is a cross-sectional view showing a cross-sectional structure taken along the line X2—X2 of FIG. 7.
Figure 9:
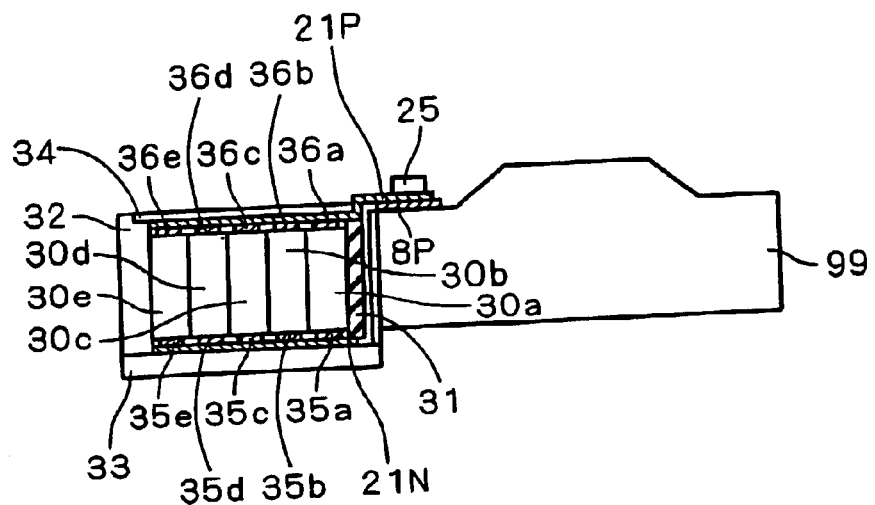
FIG. 9 is a cross-sectional view showing a cross-sectional structure taken along the line X3—X3 of FIG. 7.

FIG. 7 is a top plan view schematically showing the overall construction of the power module according to a second preferred embodiment of the present invention. FIGS. 8 and 9 are cross-sectional views showing cross-sectional structures taken along the lines X2—X2 and X3—X3 of FIG. 7, respectively. With reference to FIG. 7, a plurality of capacitor elements 30a to 30e are arranged in a smoothing capacitor enclosure 32. Referring to FIG. 8, the capacitor elements 30a to 30e have N-electrodes 35a to 35e at their bottom surfaces, respectively. The N-electrodes 35a to 35e are commonly in contact with the plate-shaped N-electrode 21N. Part of the N-electrode 21N extends to a top surface of the enclosure 32 and is fastened by the screw 25 to the N-terminal 8N of the power module body portion 99.

Referring to FIG. 9, the capacitor elements 30a to 30e have P-electrodes 36a to 36e at their top surfaces, respectively. The P-electrodes 36a to 36e are commonly in contact with the plate-shaped P-electrode 21P. Part of the P-electrode 21P extends to the top surface of the enclosure 32 and is fastened by the screw 25 to the P-terminal 8P of the power module body portion 99.

Like the smoothing capacitor 20 of the first preferred embodiment, the enclosure 32 is disposed in contact with the side surface of the case frame 6 and has the top surface level with the top surface of the case frame 6. An insulator 31 is provided between a side surface of the capacitor element 30a and the N-electrode 21N. The bottom surface of the enclosure 32 has a heat sink 33 for dissipating heat generated by the capacitor elements 30a to 30e to the outside. The capacitor elements 30a to 30e are forced against and fixed to the bottom surface of the enclosure 32, with the N-electrode 21N therebetween, by a pressing force of a hold-down plate 34 screw-held to the top surface of the enclosure 32.

The power module according to the second preferred embodiment thus produces effects to be described below in addition to the effects produced by the power module of the first preferred embodiment. Fixing the plurality of capacitor elements 30a to 30e in the enclosure 32 requires only fastening the hold-down plate 34 to the top surface of the enclosure 32 with the single screw. Therefore, the step of mounting the plurality of capacitor elements is simplified.

Additionally, the bottom surface of the enclosure 32 has the single heat sink 33 for dissipating the heat generated by the capacitor elements 30a to 30e to the outside. This enhances the uniformity of the effect of cooling the plurality of capacitor elements 30a to 30e.

An elastic material may be used as the electrode material to impart elasticity to at least one of the set of N-electrodes 35a to 35e and the set of P-electrode 36a to 36e. This prevents breakage of the capacitor elements 30a to 30e resulting from the pressing force of the hold-down plate 34 or the thermal stress associated with the heat generated by the capacitor elements 30a to 30e, and also ensures the contact between the N-electrode 21N and the N-electrodes 35a to 35e and between the P-electrode 21P and the P-electrodes 36a to 36e.

Figure 10:
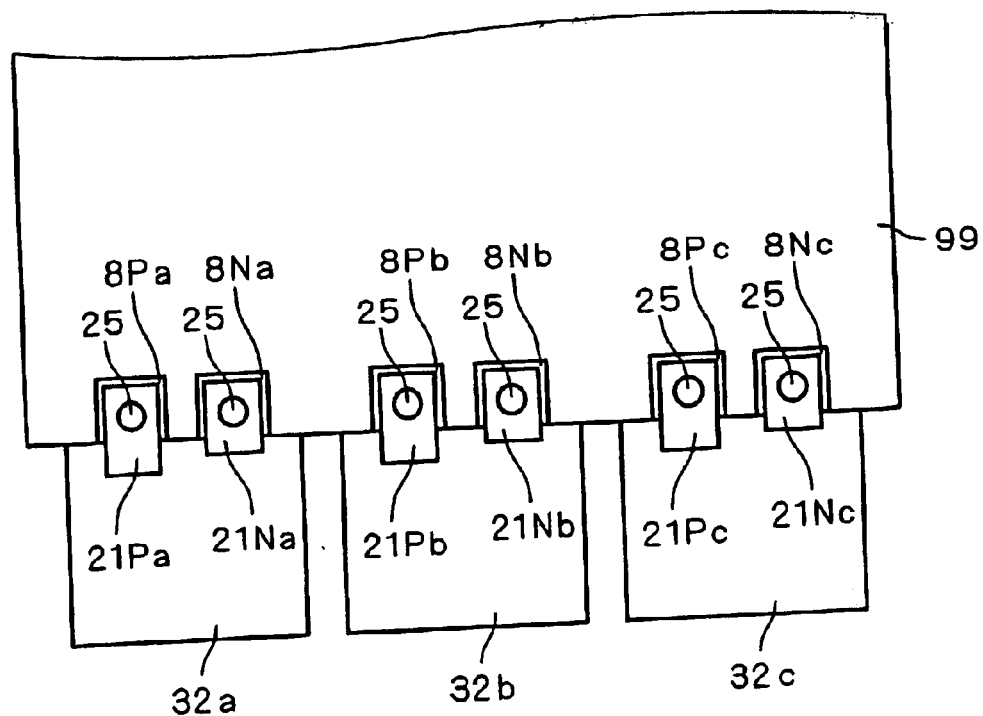
FIG. 10 is a top plan view schematically showing the overall construction of the power module according to a modification of the second preferred embodiment of the present invention.

FIG. 10 is a top plan view schematically shown the overall construction of the power module according to a modification of the second preferred embodiment of the present invention. Three smoothing capacitors each identical in construction with the smoothing capacitor shown in FIGS. 7 through 9 are disposed individually in corresponding relation to the three phases. In FIG. 10, the reference characters 32a to 32c designate enclosures; 21Na to 21Nc designate N-electrodes; 21Pa to 21Pc designate P-electrodes; 8Na to 8Nc designate N-terminals; and 8Pa to 8Pc designate P-terminals.

Third Preferred Embodiment

Figure 11:
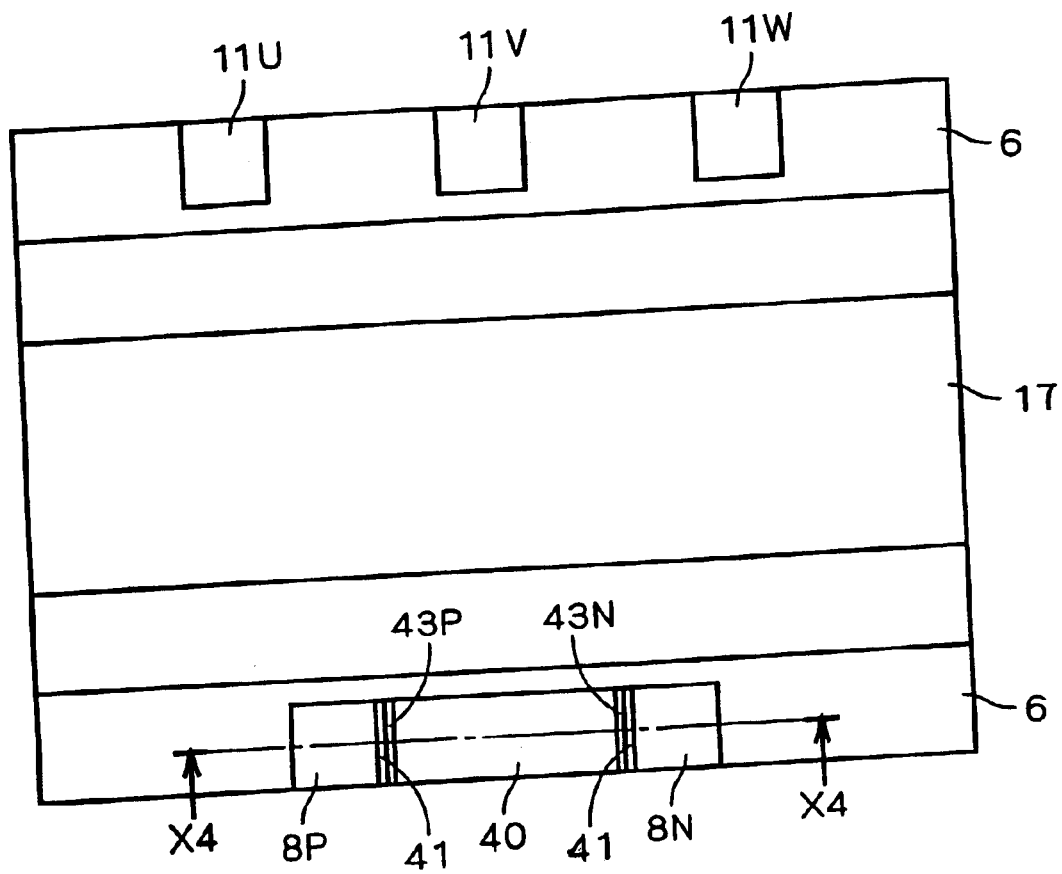
FIG. 11 is a top plan view schematically showing the overall construction of the power module according to a third preferred embodiment of the present invention.
Figure 12:
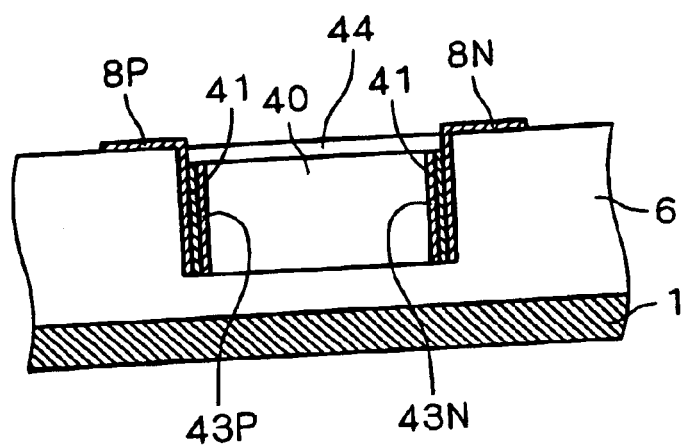
FIG. 12 is a cross-sectional view showing a cross-sectional structure taken along the line X4—X4 of FIG. 11.

FIG. 11 is a top plan view schematically showing the overall construction of the power module according to a third preferred embodiment of the present invention. FIG. 12 is a cross-sectional view showing a cross-sectional structure taken along the line X4—X4 of FIG. 11. An outer surface of the case frame 6 includes a partial recess having a pair of opposed side surfaces. The N-terminal 8N is disposed on a first one of the side surfaces of the recess, and the P-terminal 8P is disposed on a second one thereof. As shown in FIG. 12, the N-terminal 8N and the P-terminal 8P extend to parts of the top surface of the case frame 6 which surround the recess.

A smoothing capacitor 40 is shaped to fit in the recess, and has an N-electrode 43N on its first side surface opposed to the first side surface of the recess and a P-electrode 43P on its second side surface opposed to the second side surface of the recess. The smoothing capacitor 40 is fitted in the recess, and solder 41 bonds the N-electrode 43N and the N-terminal 8N together and also bonds the P-electrode 43P and the P-terminal 8P together, whereby the smoothing capacitor 40 and the case frame 6 are fixed to each other. A lid 44 fixed to the top surface of the case frame 6 is disposed on the smoothing capacitor 40.

In the power module according to the third preferred embodiment, as described above, the smoothing capacitor 40 is fitted in the recess formed in the outer surface of the case frame 6 and fixed to the case frame 6 with the solder 41. This allows direct connection between the N-electrode 43N and the N-terminal 8N and between the P-electrode 43P and the P-terminal 8P without the need for the background art connecting conductor 124. Consequently, the power module according to the third preferred embodiment can reduce the number of parts and shorten the wiring path between the smoothing capacitor 40 and the power semiconductor devices 5 to reduce the circuit inductance.

Additionally, fitting the smoothing capacitor 40 in the recess of the case frame 6 achieves the reduction in the size of the power module.

Fourth Preferred Embodiment

Figure 13:
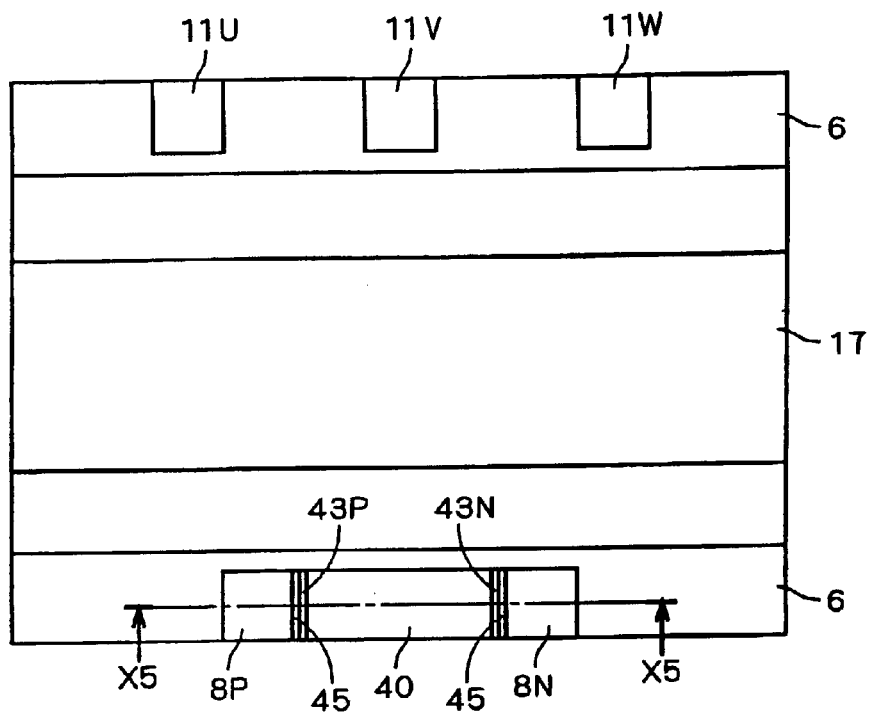
FIG. 13 is a top plan view schematically showing the overall construction of the power module according to a fourth preferred embodiment of the present invention.
Figure 14:
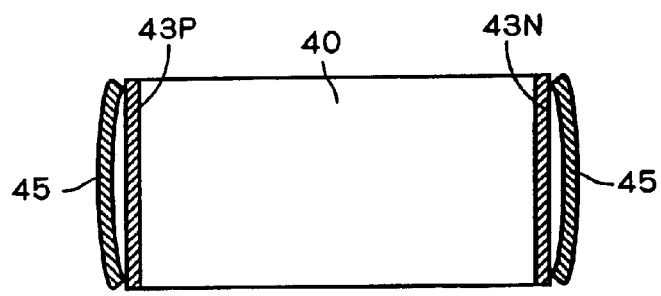
FIG. 14 is a cross-sectional view showing the smoothing capacitor and elastic members before being fixed to a case frame.
Figure 15:
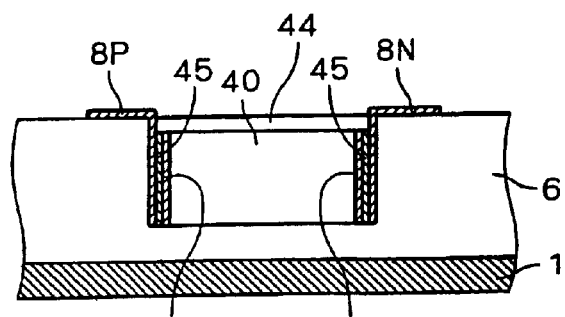
FIG. 15 is a cross-sectional view showing a cross-sectional structure taken along the line X5—X5 of FIG. 13.

FIG. 13 is a top plan view schematically showing the overall construction of the power module according to a fourth preferred embodiment of the present invention. FIG. 14 is a cross-sectional view of the smoothing capacitor 40 and elastic members 45 before being fixed to the case frame 6. FIG. 15 is a cross-sectional view showing a cross-sectional structure taken along the line X5—X5 of FIG. 13. The power module according to the fourth preferred embodiment is based on the power module according to the third preferred embodiment, but differs therefrom in that the electrically conductive elastic members 45 such as leaf springs are disposed between the N-electrode 43N and the N-terminal 8N and between the P-electrode 43P and the P-terminal 8P respectively, rather than the solder 41 which bonds the N-electrode 43N and the N-terminal 8N together and bonds the P-electrode 43P and the P-terminal 8P together. The smoothing capacitor 40 and the case frame 6 are fixed to each other by the resiliency of the compressed elastic members 45. At least one of the elastic members 45 between the N-electrode 43N and the N-terminal 8N and between the P-electrode 43P and the P-terminal 8P is required to be provided.

The power module according to the fourth preferred embodiment thus produces effects to be described below in addition to the effects produced by the power module of the third preferred embodiment. Breakage of the smoothing capacitor 40 is prevented which results from the pressing force exerted when the smoothing capacitor 40 is inserted into the recess or the thermal stress associated with the heat generated by the smoothing capacitor 40. Additionally, contact is ensured between the N-electrode 43N and the N-terminal 8N and between the P-electrode 43P and the P-terminal 8P.

Fifth Preferred Embodiment

Figure 16:
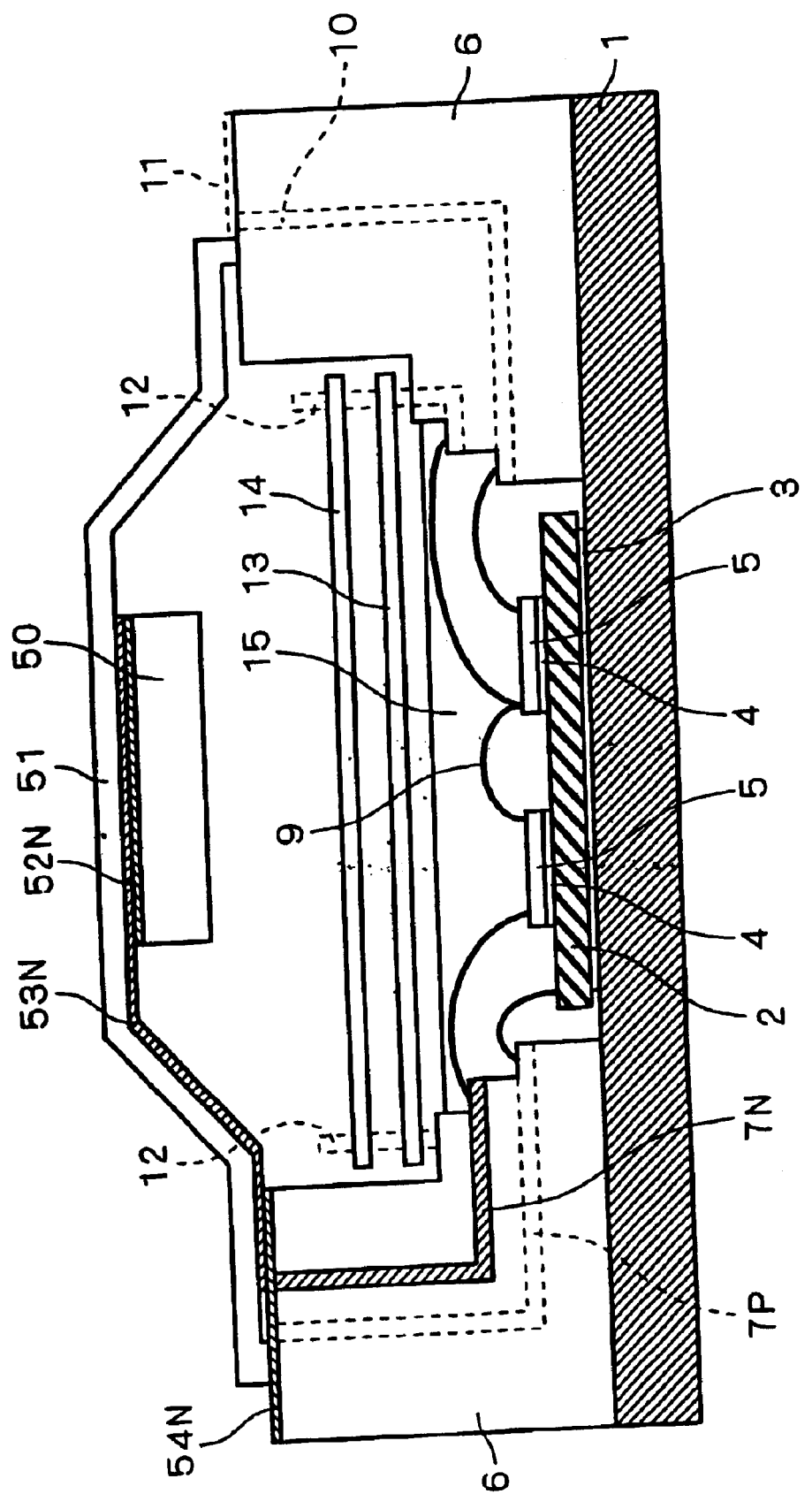
FIG. 16 is a cross-sectional view showing a cross-sectional structure of a portion of the power module in which an N-terminal is disposed according to a fifth preferred embodiment of the present invention.

FIG. 16 is a cross-sectional view showing a cross-sectional structure of a portion of the power module in which an N-terminal 54N is disposed according to a fifth preferred embodiment of the present invention. A smoothing capacitor 50 is mounted on the underside (or a surface opposed to the control substrate 14) of a case lid 51. The N-terminal 54N extends from the outside of the case lid 51 to the inside on the top surface of the case frame 6. An N-electrode 52N is formed on a top surface (or a surface for contact with the underside of the case lid 51) of the smoothing capacitor 50. The N-electrode 52N is connected to the N-terminal 54N through a connecting electrode 53N formed on the underside of the case lid 51. The N-terminal 54N is connected through the N-electrode 7N and the aluminum wires 9 to the power semiconductor devices 5.

Figure 17:
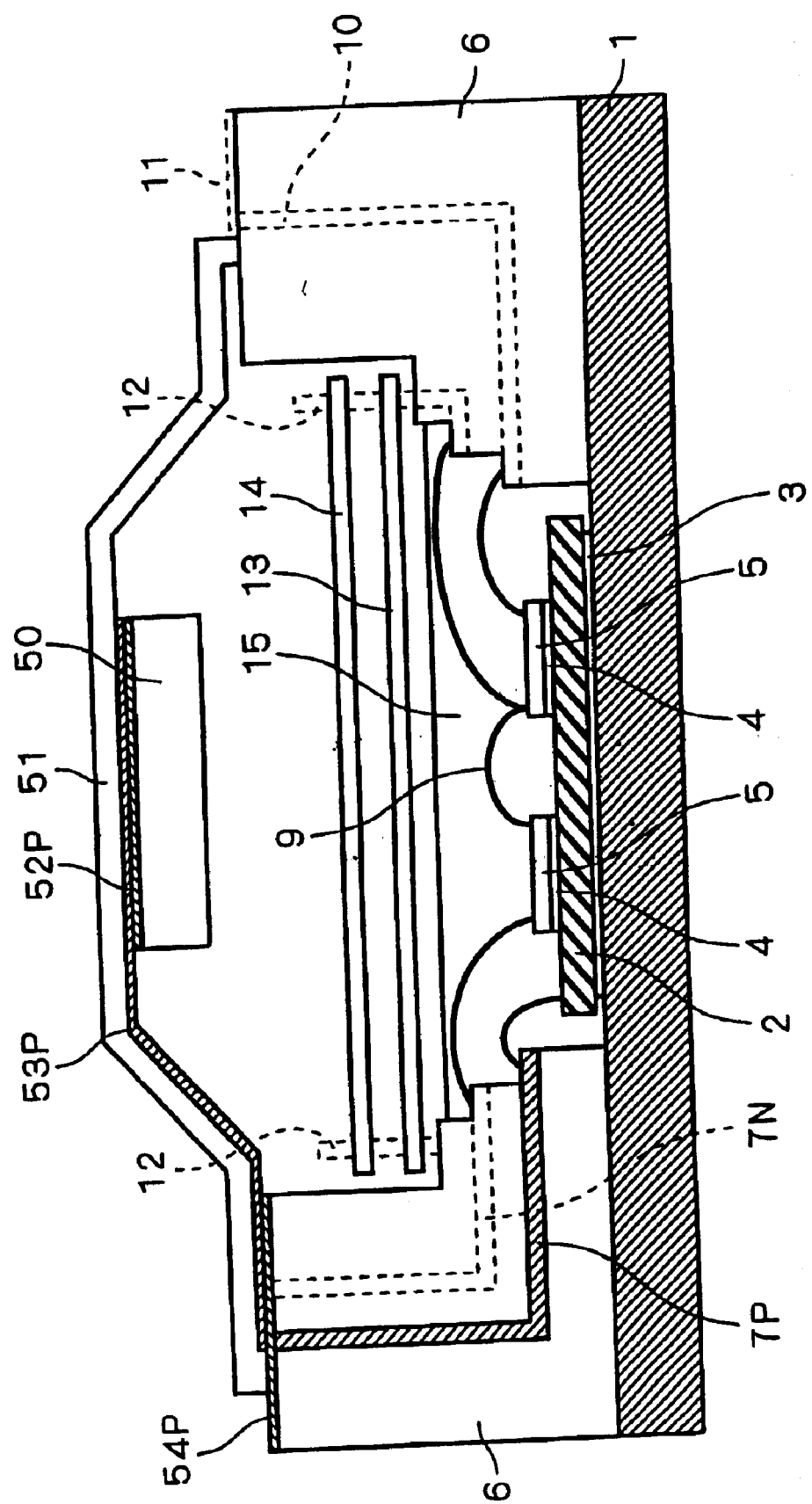
FIG. 17 is a cross-sectional view showing a cross-sectional structure of a portion of the power module in which a P-terminal is disposed according to the fifth preferred embodiment of the present invention.

FIG. 17 is a cross-sectional view showing a cross-sectional structure of a portion of the power module in which a P-terminal 54P is disposed according to the fifth preferred embodiment of the present invention. The P-terminal 54P extends from the outside of the case lid 51 to the inside on the top surface of the case frame 6. A P-electrode 52P is formed on the top surface of the smoothing capacitor 50. The P-electrode 52P is connected to the P-terminal 54P through a connecting electrode 53P formed on the underside of the case lid 51. The P-terminal 54P is connected through the P-electrode 7P, the aluminum wires 9 and the circuit pattern formed on the insulating substrate 2 to the power semiconductor devices 5.

In the power module according to the fifth preferred embodiment, as described above, the smoothing capacitor 50 is disposed on the underside of the case lid 51 within the case formed by the case frame 6 and the case lid 51. This shortens the wiring path between the smoothing capacitor 50 and the power semiconductor devices 5 to reduce the circuit inductance.

Additionally, the smoothing capacitor 50, which is isolated from an environment external to the case, is inhibited from the deposition of contaminants and the formation of rust which result from the external environment. In other words, the environmental resistance of the smoothing capacitor 50 is improved.

Further, since the smoothing capacitor 50 is mounted in contact with the case lid 51, the heat generated by the smoothing capacitor 50 is dissipated through the case lid 51 to the outside. Although the case lid 51 shown in FIGS. 16 and 17 is relatively flat, the case lid 51 may be formed into a fin-like contour to further improve the heat-dissipating property.

Sixth Preferred Embodiment

Figure 18:
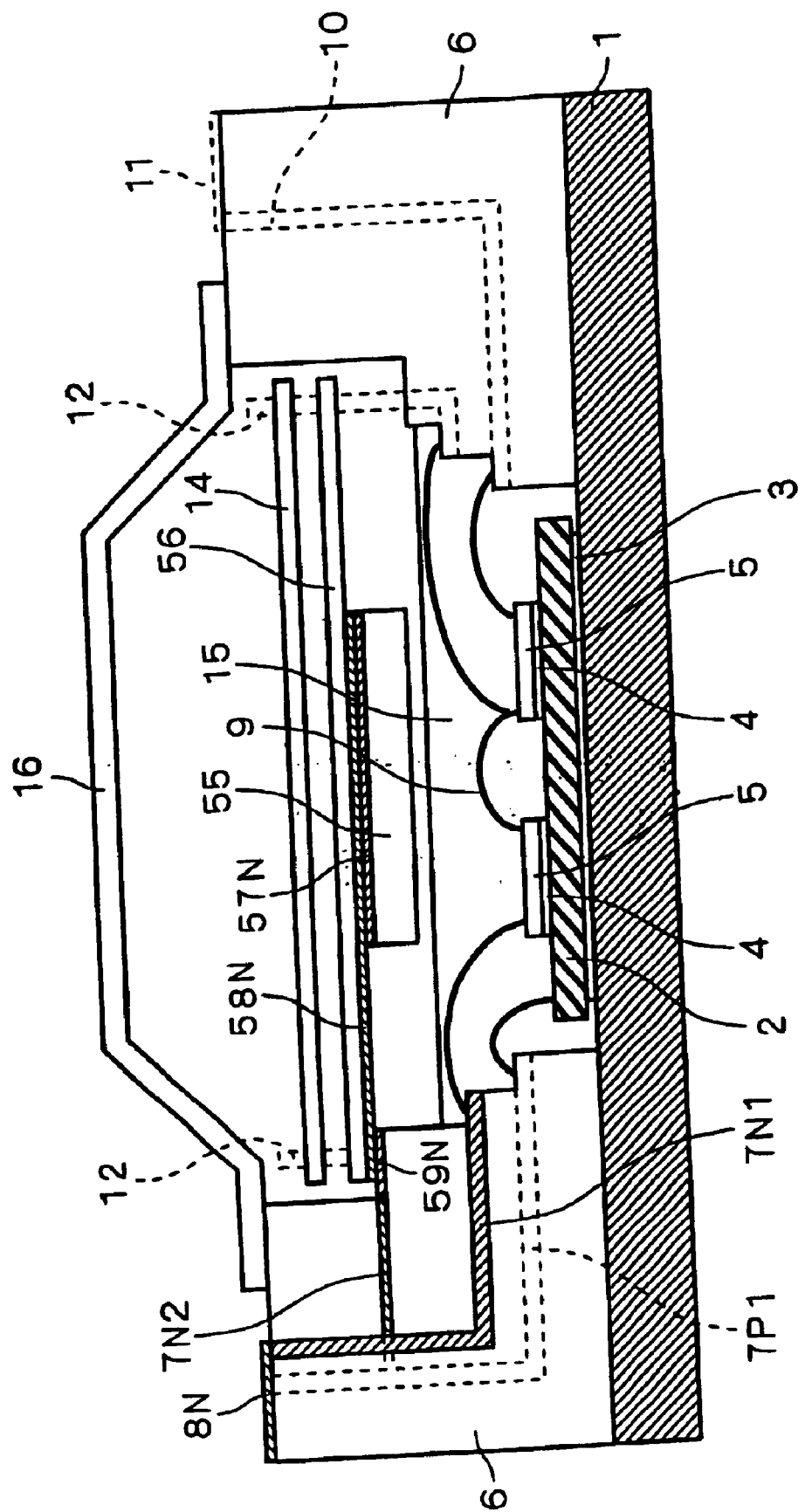
FIG. 18 is a cross-sectional view showing a cross-sectional structure of a portion of the power module in which the N-terminal is disposed according to a sixth preferred embodiment of the present invention.

FIG. 18 is a cross-sectional view showing a cross-sectional structure of a portion of the power module in which the N-terminal 8N is disposed according to a sixth preferred embodiment of the present invention. A shield plate 56 is disposed between the control substrate 14 and the insulating substrate 2, and the inner surface of the case frame 6 has a stepped structure in contact with part of the periphery of the shield plate 56. A terminal 59N is formed on a top surface of the stepped structure, and is connected to an N-electrode 7N1 through a connecting electrode 7N2 buried in the case frame 6. The N-electrode 7N1 has a first end connected to the N-terminal 8N, and a second end connected through the aluminum wires 9 to the power semiconductor devices 5.

A smoothing capacitor 55 is mounted on the underside (or a surface opposed to the insulating substrate 2) of the shield plate 56. An N-electrode 57N is formed on a top surface (or a surface for contact with the underside of the shield plate 56) of the smoothing capacitor 55. The N-electrode 57N is connected to the terminal 59N through a connecting electrode 58N formed on the underside of the shield plate 56.

Figure 19:
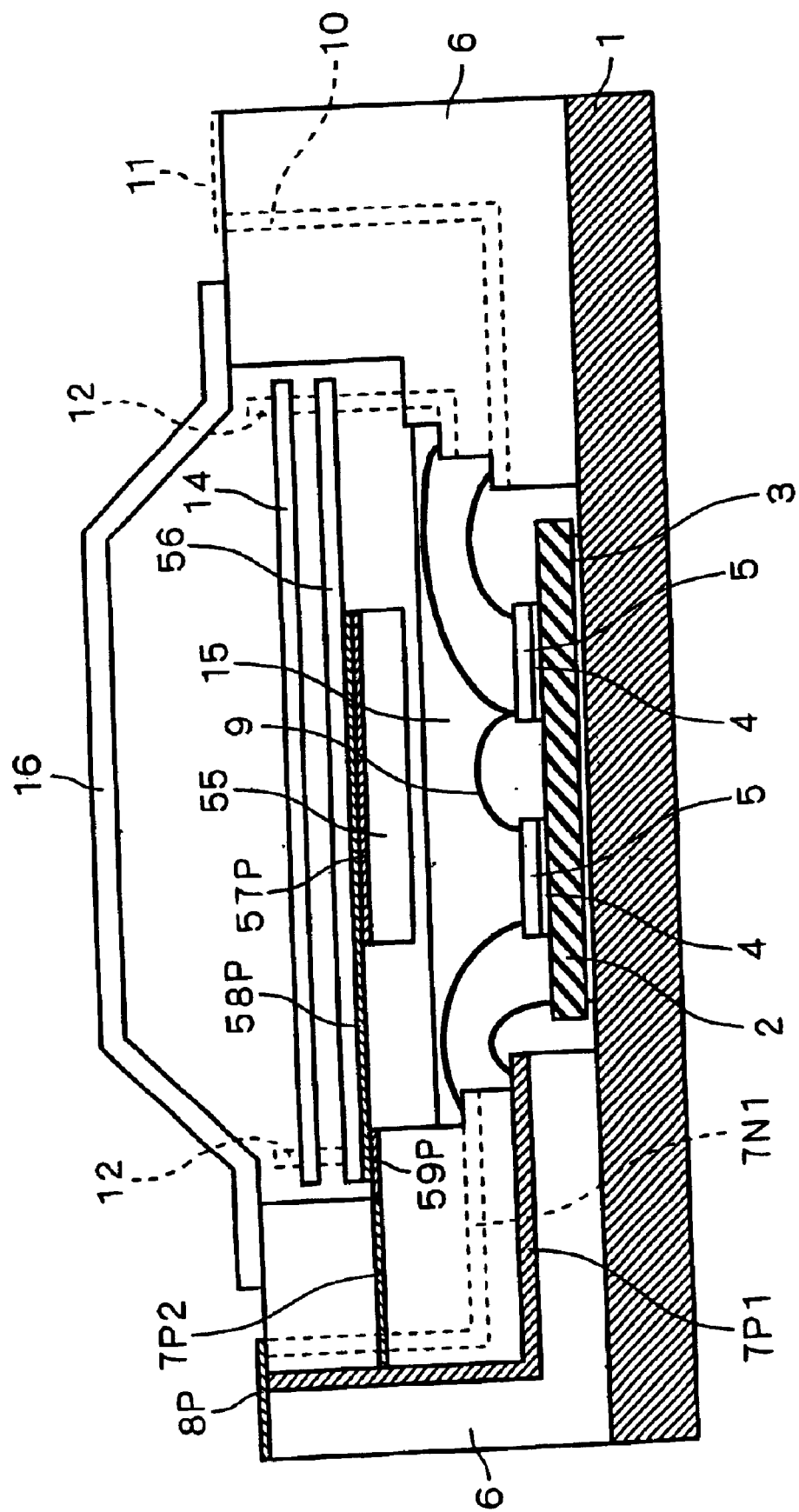
FIG. 19 is a cross-sectional view showing a cross-sectional structure of a portion of the power module in which the P-terminal is disposed according to the sixth preferred embodiment of the present invention.

FIG. 19 is a cross-sectional view showing a cross-sectional structure of a portion of the power module in which the P-terminal 8P is disposed according to the sixth preferred embodiment of the present invention. A terminal 59P is formed on a top surface of the stepped structure, and is connected to a P-electrode 7P1 through a connecting electrode 7P2 buried in the case frame 6. The P-electrode 7P1 has a first end connected to the P-terminal 8P, and a second end connected through the aluminum wires 9 and the circuit pattern formed on the insulating substrate 2 to the power semiconductor devices 5. A P-electrode 57P is formed on the top surface of the smoothing capacitor 55. The P-electrode 57P is connected to the terminal 59P through a connecting electrode 58P formed on the underside of the shield plate 56.

In the power module according to the sixth preferred embodiment, as described above, the smoothing capacitor 55 is disposed on the underside of the shield plate 56 within the case formed by the case frame 6 and the case lid 16. This allows a shorter wiring path between the smoothing capacitor 55 and the power semiconductor devices 5 than that of the power module of the fifth preferred embodiment, to further reduce the circuit inductance. Additionally, the smoothing capacitor 55 which is isolated from the external environment has improved environmental resistance.

Seventh Preferred Embodiment

Figure 20:
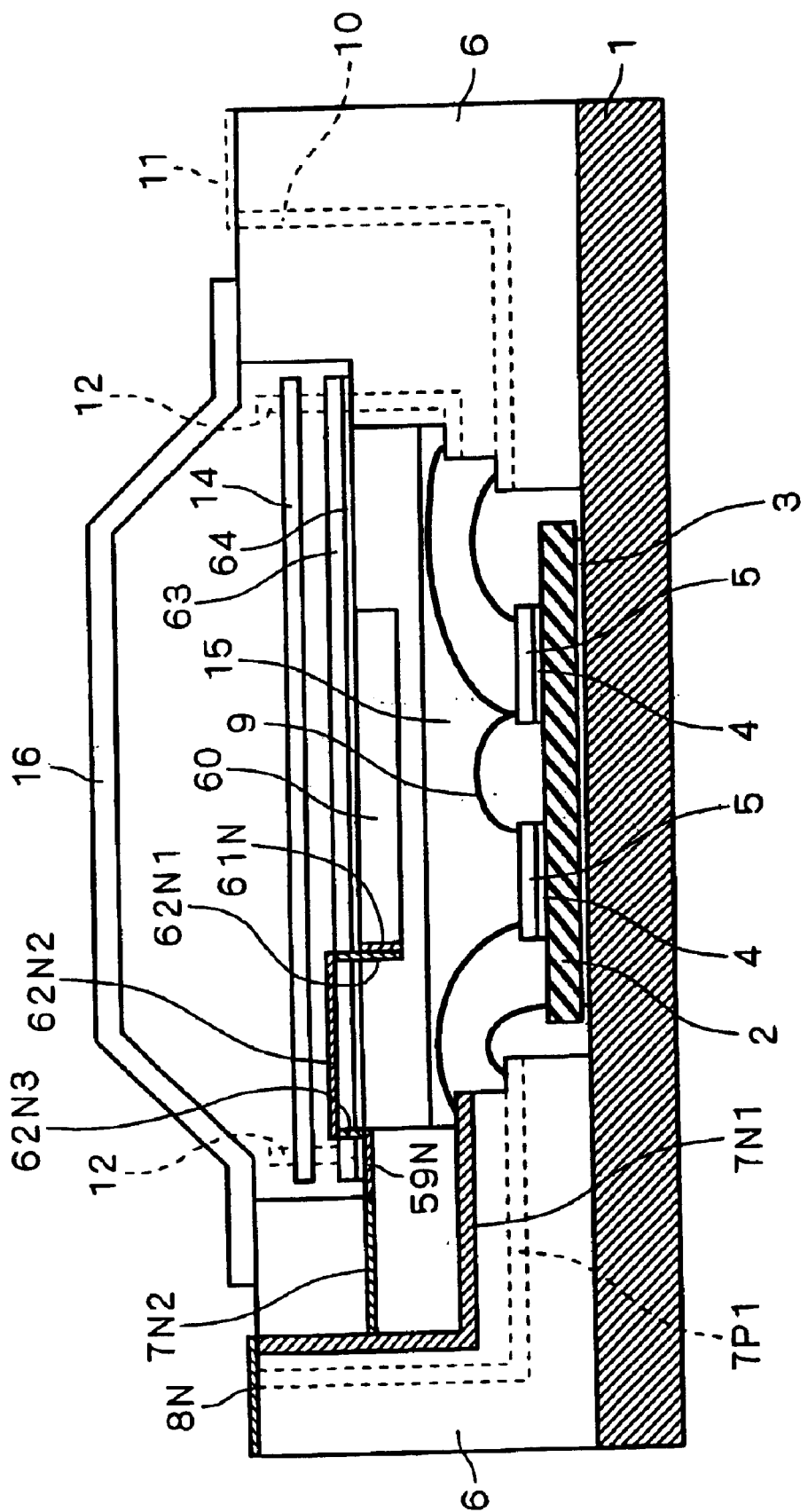
FIG. 20 is a cross-sectional view showing a cross-sectional structure of a portion of the power module in which the N-terminal is disposed according to a seventh preferred embodiment of the present invention.

FIG. 20 is a cross-sectional view showing a cross-sectional structure of a portion of the power module in which the N-terminal 8N is disposed according to a seventh preferred embodiment of the present invention. The power module according to the seventh preferred embodiment is based on the power module according to the sixth preferred embodiment, but differs therefrom in that a shield plate 63 including a printed wiring board is in particular employed as the shield plate 56. The case frame 6 has a stepped structure along the inner surface thereof and in contact with the periphery of the shield plate 63. The underside of the shield plate 63 is entirely covered with a thermally conductive sheet 64. A smoothing capacitor 60 is disposed beneath the thermally conductive sheet 64 in a central region of the shield plate 63.

An N-electrode 61N on a first side surface of the smoothing capacitor 60 is connected through a connecting electrode 62N1, a conductive pattern 62N2 and a connecting electrode 62N3 in the order named to the terminal 59N. The connecting electrode 62N1 is in contact with the N-electrode 61N and extends through the shield plate 63. The conductive pattern 62N2 is formed on the top surface of the shield plate 63 and is in contact with the connecting electrode 62N1. The connecting electrode 62N3 is in contact with the conductive pattern 62N2 and extends through the shield plate 63.

Figure 21:
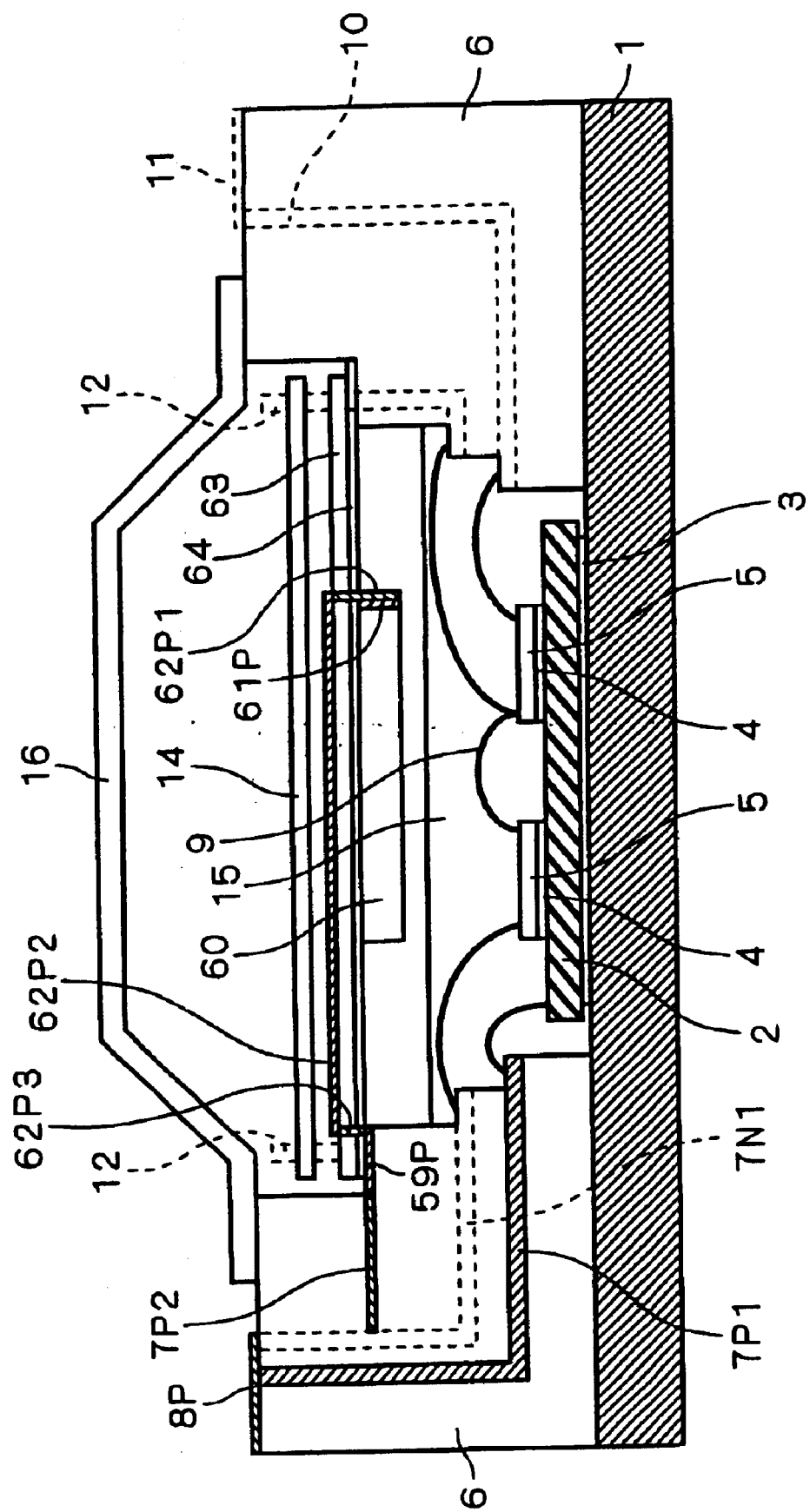
FIG. 21 is a cross-sectional view showing a cross-sectional structure of a portion of the power module in which the P-terminal is disposed according to the seventh preferred embodiment of the present invention.

FIG. 21 is a cross-sectional view showing a cross-sectional structure of a portion of the power module in which the P-terminal 8P is disposed according to the seventh preferred embodiment of the present invention. A P-electrode 61P on a second side surface of the smoothing capacitor 60 which is opposite from the first side surface is connected through a connecting electrode 62P1, a conductive pattern 62P2 and a connecting electrode 62P3 in the order named to the terminal 59P. The connecting electrode 62P1 is in contact with the P-electrode 61P and extends through the shield plate 63. The conductive pattern 62P2 is formed on the top surface of the shield plate 63 and is in contact with the connecting electrode 62P1. The connecting electrode 62P3 is in contact with the conductive pattern 62P2 and extends through the shield plate 63.

Other constituents of the power module according to the seventh preferred embodiment are similar to those of the power module according to the sixth preferred embodiment shown in FIGS. 18 and 19.

Like the power module according to the sixth preferred embodiment, the power module according to the seventh preferred embodiment can reduce the circuit inductance and improve the environmental resistance. Since the smoothing capacitor 60 is disposed on the underside of the shield plate 63 with the thermally conductive sheet 64 therebetween, the heat generated by the smoothing capacitor 60 is effectively dissipated through the thermally conductive sheet 64 and the case frame 6 to the outside, and stresses associated with the generated heat is alleviated.

Eighth Preferred Embodiment

FIG. 22 is a cross-sectional view showing a cross-sectional structure of a portion of the power module in which the N-terminal 8N is disposed according to an eighth preferred embodiment of the present invention. The power module according to the eighth preferred embodiment is based on the power module according to the sixth preferred embodiment, but differs therefrom in that a shield plate 65 made of metal is in particular employed as the shield plate 56. The N-electrode 57N of the smoothing capacitor 55 and the terminal 59N on the top surface of the stepped structure are connected to each other through a connecting conductor 66N provided on the underside of the shield plate 65 and coated with a thin insulation film.

Figure 23:
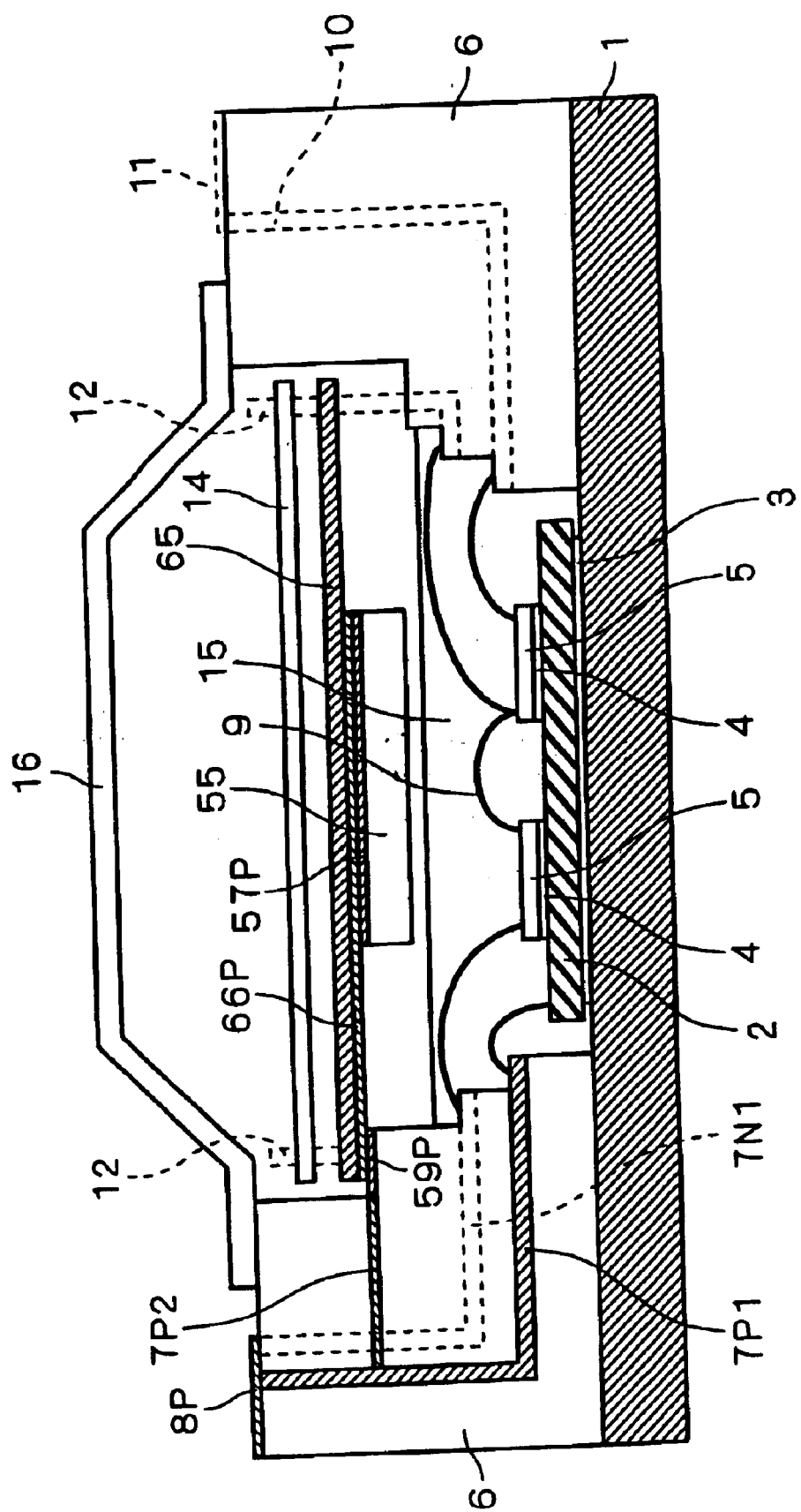
FIG. 23 is a cross-sectional view showing a cross-sectional structure of a portion of the power module in which the P-terminal is disposed according to the eighth preferred embodiment of the present invention.

FIG. 23 is a cross-sectional view showing a cross-sectional structure of a portion of the power module in which the P-terminal 8P is disposed according to the eighth preferred embodiment of the present invention. The P-electrode 57P of the smoothing capacitor 55 and the terminal 59P on the top surface of the stepped structure are connected to each other through a connecting conductor 66P provided on the underside of the shield plate 65 and coated with a thin insulation film.

Other constituents of the power module according to the eighth preferred embodiment are similar to those of the power module according to the sixth preferred embodiment shown in FIGS. 18 and 19.

Like the power module according to the sixth preferred embodiment, the power module according to the eighth preferred embodiment can reduce the circuit inductance and improve the environmental resistance. Since the smoothing capacitor 55 is disposed on the underside of the shield plate 65 of metal, the heat generated by the smoothing capacitor 55 is effectively dissipated through the shield plate 65 and the case frame 6 to the outside.

Ninth Preferred Embodiment

Figure 24:
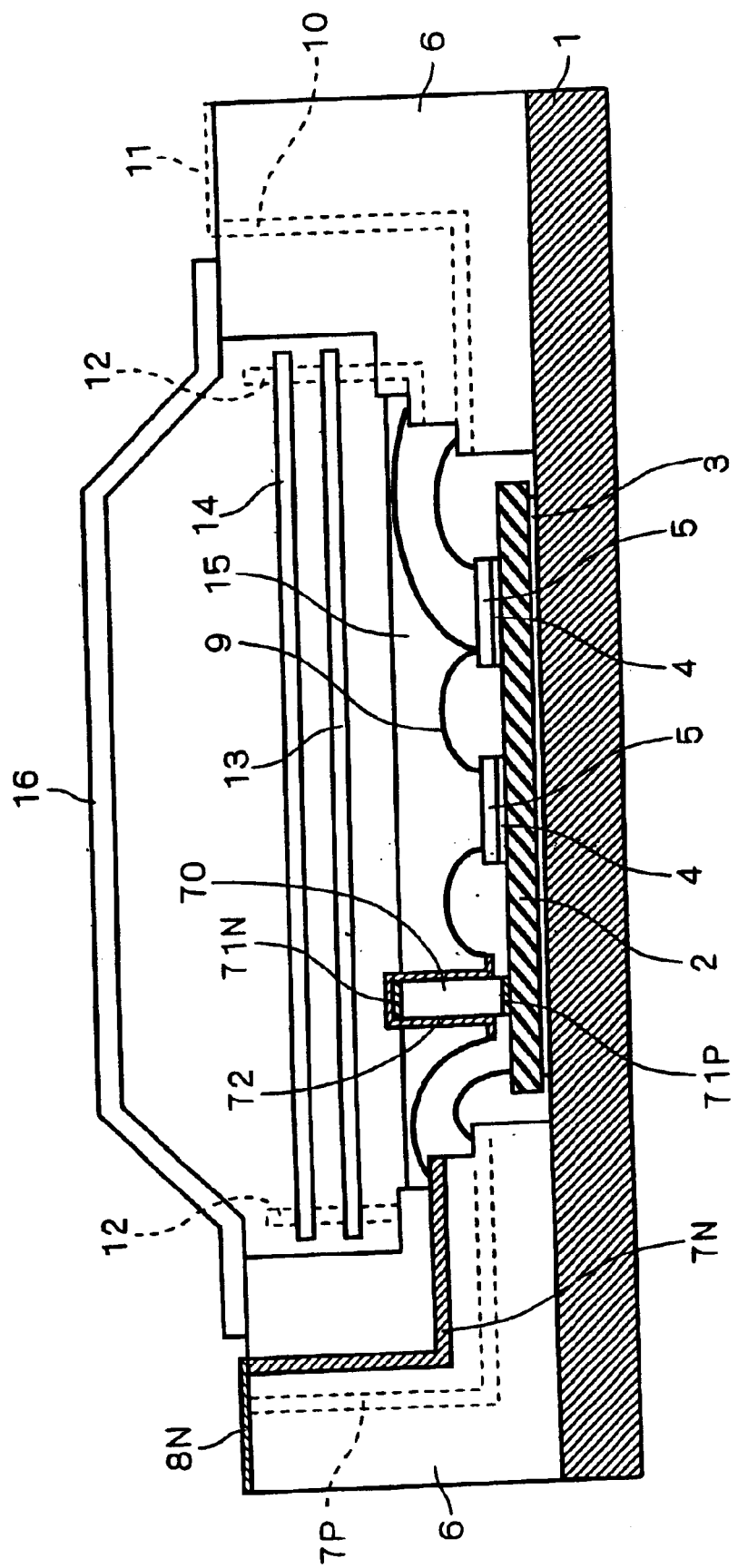
FIG. 24 is a cross-sectional view showing a cross-sectional structure of the power module according to a ninth preferred embodiment of the present invention.

FIG. 24 is a cross-sectional view showing a cross-sectional structure of the power module according to a ninth preferred embodiment of the present invention. A smoothing capacitor 70 in a vertical position is disposed on the top surface of the insulating substrate 2 except where the power semiconductor devices 5 are mounted. An N-electrode 71N is formed on a top surface of the smoothing capacitor 70, and a connecting electrode 72 is disposed to cover the N-electrode 71N and in non-contacting relationship with a P-electrode 71P. The connecting electrode 72 has a first end connected through the aluminum wires 9 to the N-electrode 7N, and a second end connected through the aluminum wires 9 to the power semiconductor devices 5.

The P-electrode 71P is formed on a bottom surface of the smoothing capacitor 70, and is connected through the circuit pattern formed on the insulating substrate 2 to the power semiconductor devices 5. The P-electrode 71P is also connected through the circuit pattern and the aluminum wires 9 to the P-electrode 7P (indicated by the broken lines in FIG. 24 since it does not appear actually in the same cross-section as the N-electrode 7N).

In the power module according to the ninth preferred embodiment, the smoothing capacitor 70 is disposed within the case formed by the case frame 6 and the case lid 16 to improve the environmental resistance, as in the power module of the fifth to eighth preferred embodiments.

The provision of the smoothing capacitor 70 on the insulating substrate 2 significantly shortens the wiring path between the smoothing capacitor 70 and the power semiconductor devices 5, to greatly reduce the circuit inductance.

The smoothing capacitor 70 may be made of the same material as the insulating substrate 2. For example, when the insulating substrate 2 is made of ceramic, a ceramic capacitor may be used as the smoothing capacitor 70. This allows the smoothing capacitor 70 and the insulating substrate 2 to be equal in thermal expansion coefficient, to avoid various disadvantages resulting from the difference in thermal expansion coefficient, thereby enhancing the reliability of the power module.

Tenth Preferred Embodiment

Figure 25:
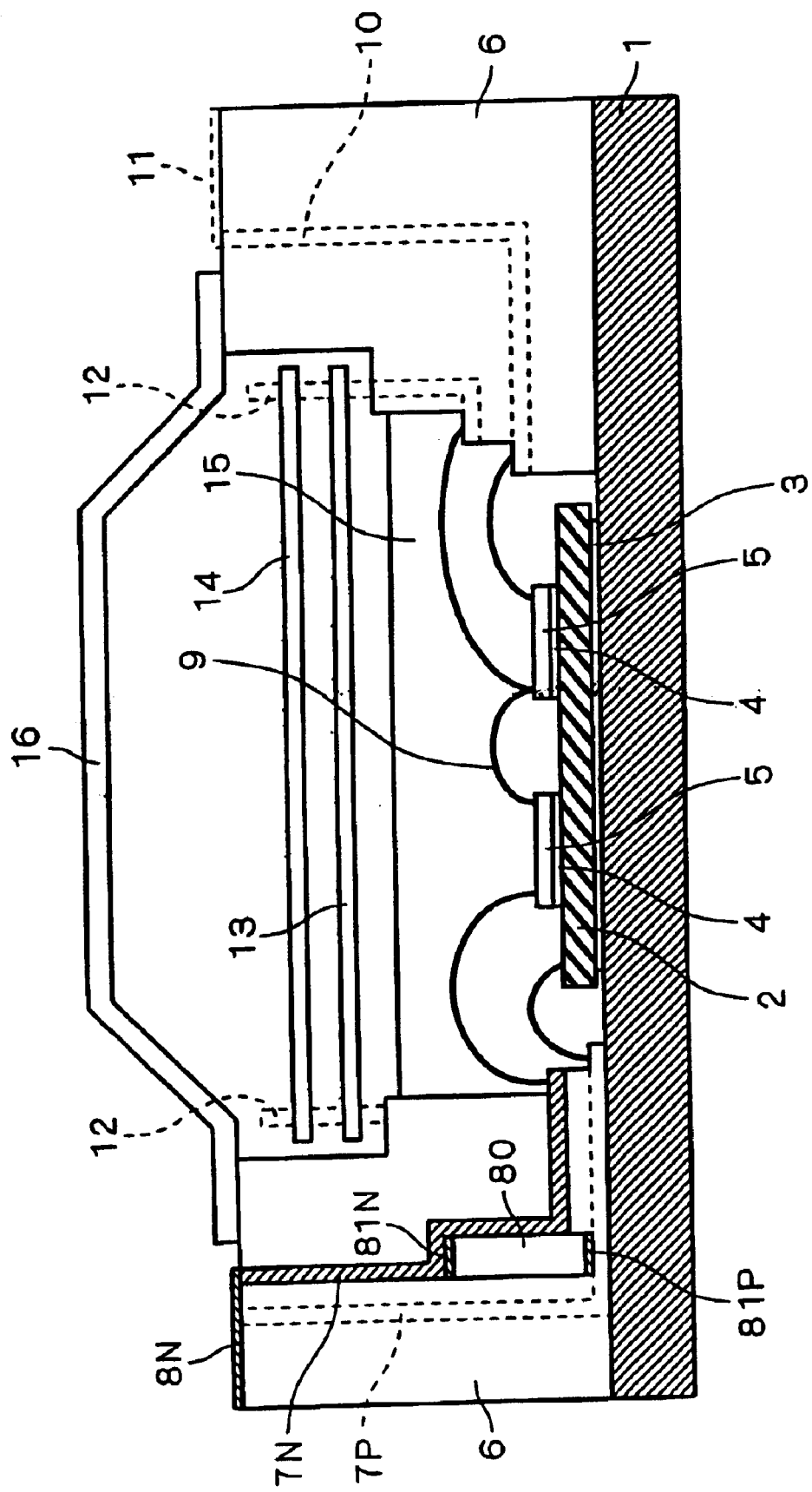
FIG. 25 is a cross-sectional view showing a cross-sectional structure of the power module according to a tenth preferred embodiment of the present invention.

FIG. 25 is a cross-sectional view showing a cross-sectional structure of the power module according to a tenth preferred embodiment of the present invention. A smoothing capacitor 80 in a vertical position is disposed on the top surface of the base plate 1 except where the insulating substrate 2 is disposed. In particular, the smoothing capacitor 80 in the structure of FIG. 25 is shown as buried in the case frame 6. An N-electrode 81N is formed on a top surface of the smoothing capacitor 80. The N-electrode 81N is brought into contact with and fixed to the N-electrode 7N with an electrically conductive bonding material, solder or the like.

A P-electrode 81P is formed on a bottom surface of the smoothing capacitor 80. The P-electrode 81P is brought into contract with and fixed to the P-electrode 7P (indicated by the broken lines in FIG. 25 since it does not appear actually in the same cross-section as the N-electrode 7N) with an electrically conductive bonding material, solder or the like. The P-electrode 7P and the base plate 1 are insulated from each other.

Like the power module according to the fifth to ninth preferred embodiments, the power module according to the tenth preferred embodiment can improve the environmental resistance. Additionally, the smoothing capacitor 80 disposed on the base plate 1 made of metal allows the heat generated by the smoothing capacitor 80 to be effectively dissipated through the base plate 1 to the outside.

Moreover, the N-electrode 81N and the P-electrode 81P of the smoothing capacitor 80 are brought into direct contact with and fixed to the N-electrode 7N and the P-electrode 7P, respectively. This produces effects to be described below. As compared with connection between the electrodes through the connecting electrode and the like, the arrangement of the tenth preferred embodiment requires no member for connection between the electrodes to reduce the weight and costs. Further, as compared with the use of a screw for fixing of the connecting electrodes connected to the N-electrode 81N and the P-electrode 81P of the smoothing capacitor 80 and the terminals connected to the N-electrode 7N and the P-electrode 7P to each other, the arrangement of the tenth preferred embodiment avoids the generation of a contact resistance at a screw-held portion, to suppress the energy loss of the entire power module. This also suppresses the heat generation associated with the contact resistance to achieve the size reduction of a cooling mechanism.

Eleventh Preferred Embodiment

Figure 26:
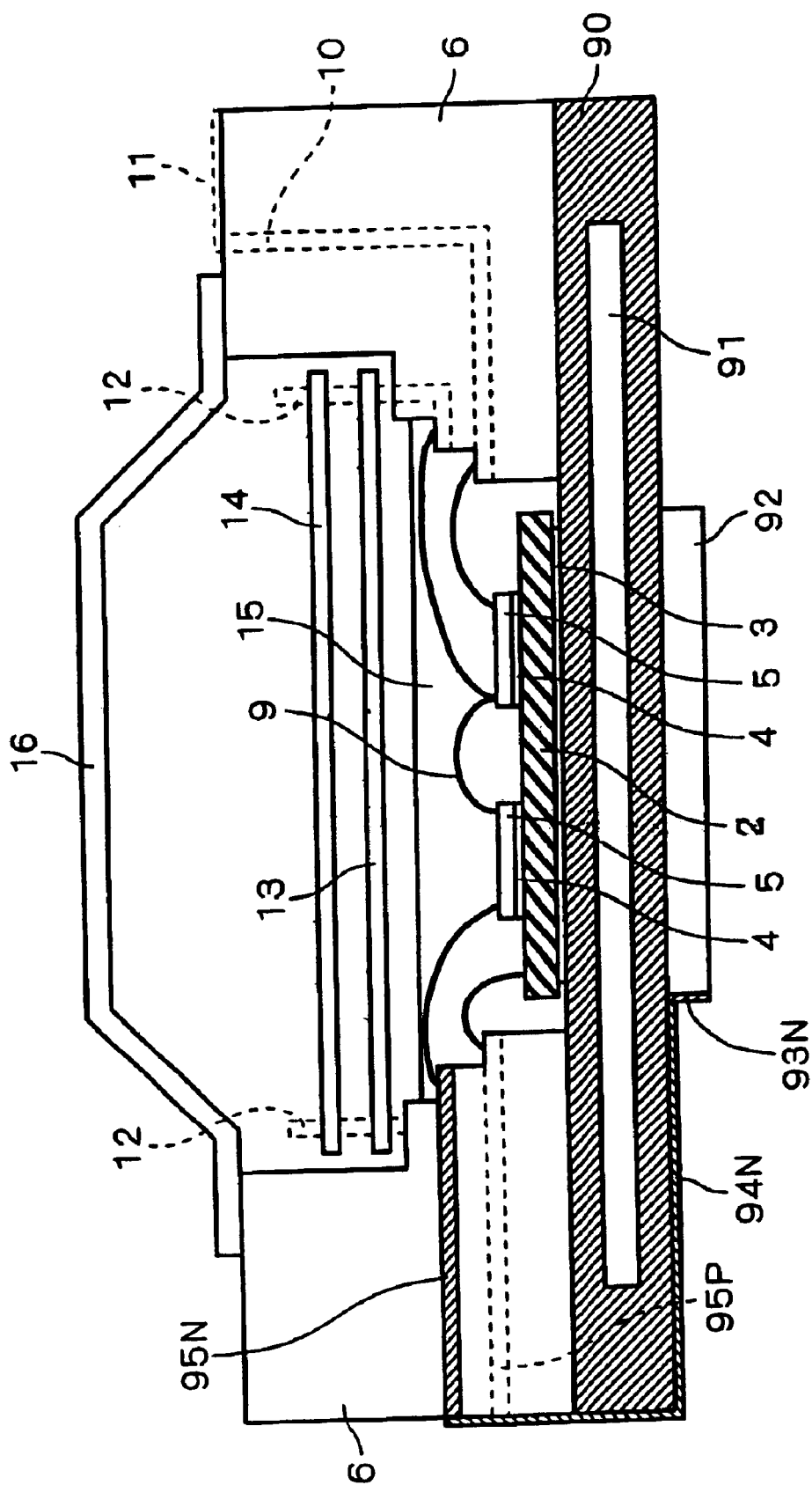
FIG. 26 is a cross-sectional view showing a cross-sectional structure of a portion of the power module in which an N-electrode is disposed according to an eleventh preferred embodiment of the present invention.

FIG. 26 is a cross-sectional view showing a cross-sectional structure of a portion of the power module in which an N-electrode 95N is disposed according to an eleventh preferred embodiment of the present invention. The case frame 6 and the insulating substrate 2 in a horizontal position are disposed on a water-cooling fin 90 having therein a coolant flow path 91. A smoothing capacitor 92 is disposed on the underside (or a surface opposite from the surface on which the insulating substrate 2 is formed) of the water-cooling fin 90. The N-electrode 95N extending from the inner surface of the case frame 6 to the outer surface thereof is buried in the case frame 6. An N-electrode 93N formed on a side surface of the smoothing capacitor 92 is connected through a connecting conductor 94N to the N-electrode 95N. The connecting conductor 94N is formed partially on bottom and side surfaces of the water-cooling fin 90 and the outer surface of the case frame 6.

Figure 27:
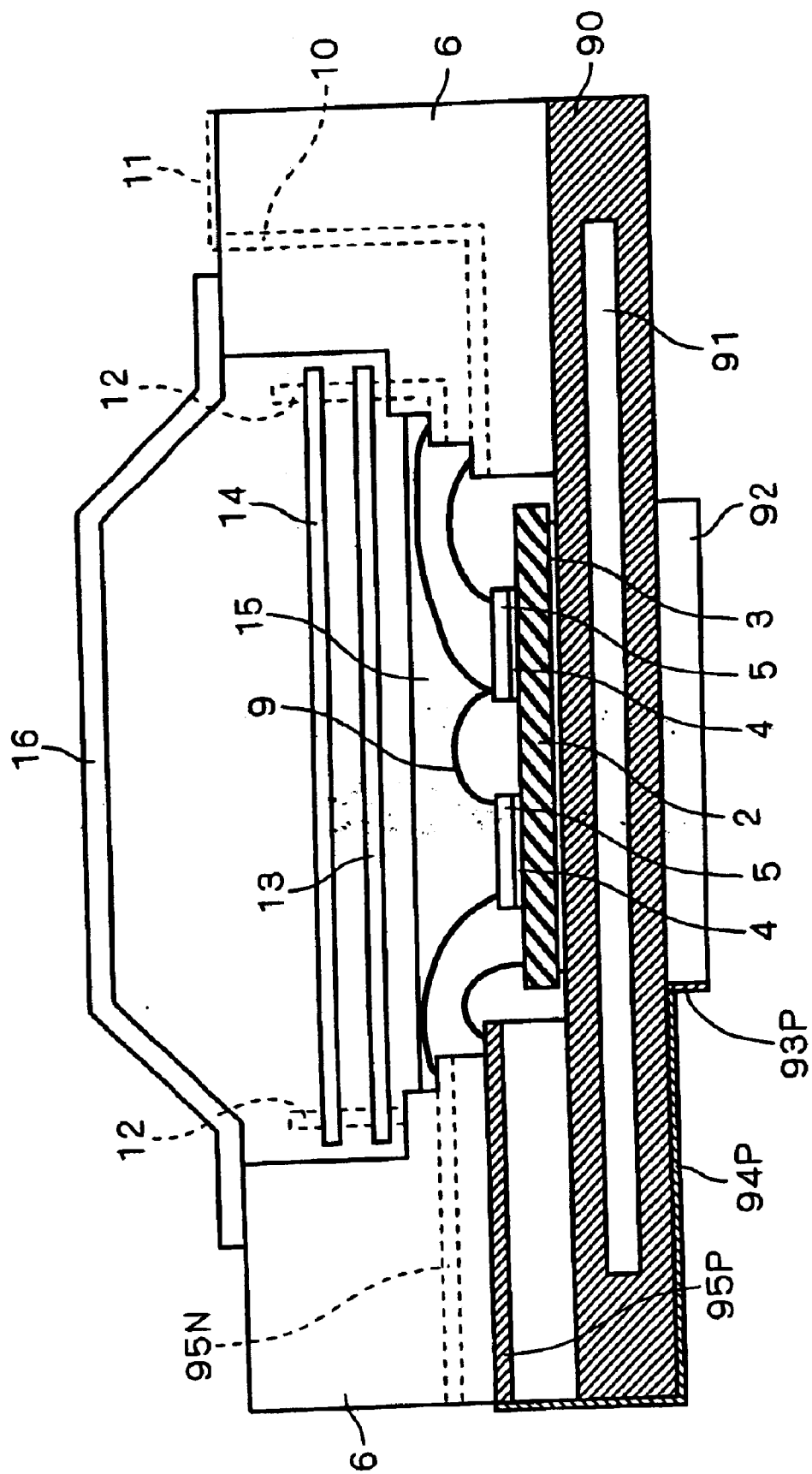
FIG. 27 is a cross-sectional view showing a cross-sectional structure of a portion of the power module in which a P-electrode is disposed according to the eleventh preferred embodiment of the present invention.
Figure 30:
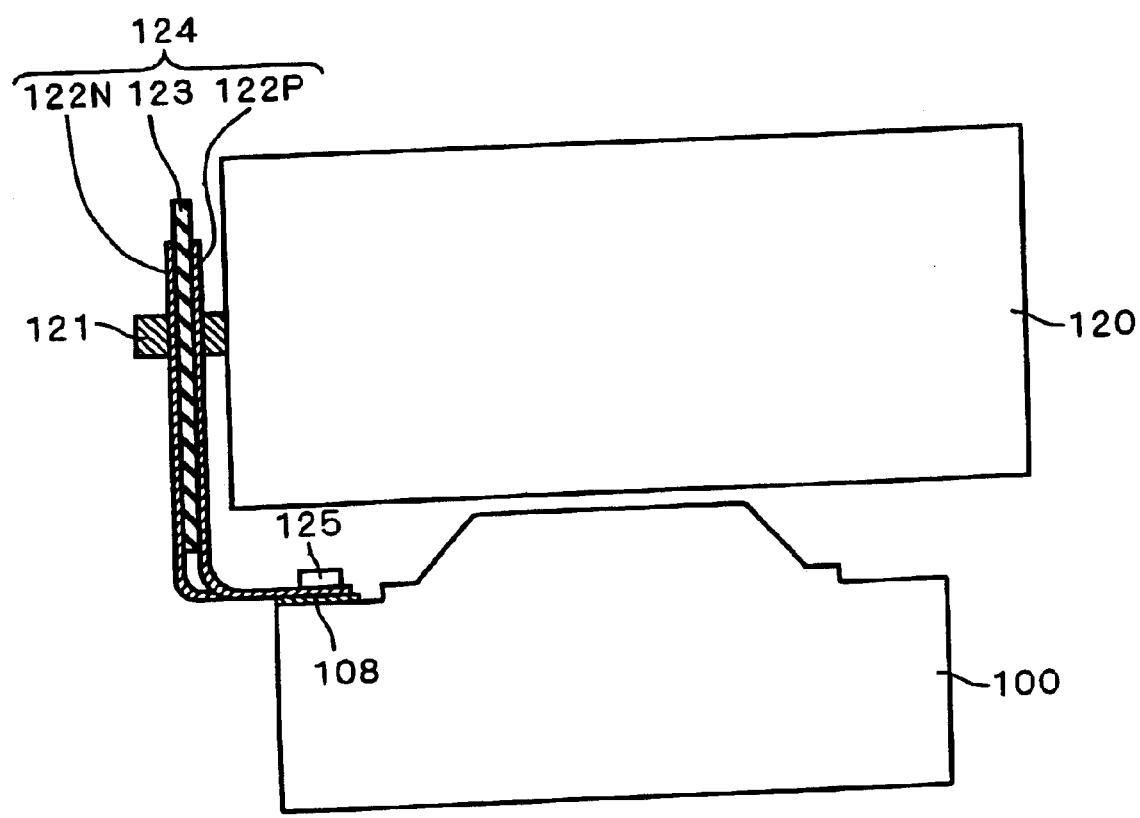
FIG. 30 is a cross-sectional view schematically showing the overall construction of a background art power module, as viewed in side elevation.
Figure 31:
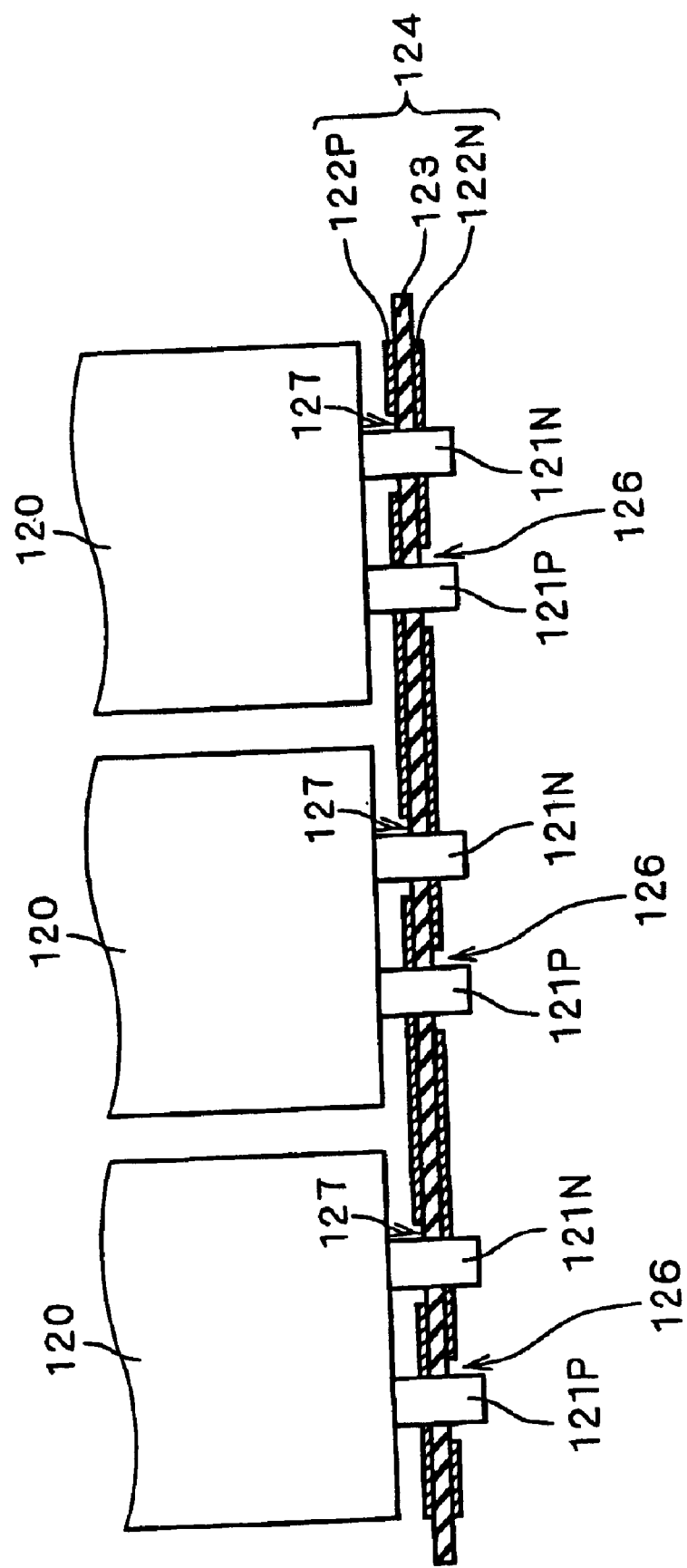
FIG. 31 is a cross-sectional view schematically showing a structure of connections between smoothing capacitors and a connecting conductor, as viewed in top plan.

FIG. 27 is a cross-sectional view showing a cross-sectional structure of a portion of the power module in which a P-electrode 95P is disposed according to the eleventh preferred embodiment of the present invention. The P-electrode 95P extending from the inner surface of the case frame 6 to the outer surface thereof is buried in the case frame 6. A P-electrode 93P formed on a side surface of the smoothing capacitor 92 is connected through a connecting conductor 94P to the P-electrode 95P. The connecting conductor 94P is formed partially on bottom and side surfaces of the water-cooling fin 90 and the outer surface of the case frame 6.

In the power module according to the eleventh preferred embodiment, as above described, the smoothing capacitor 92 is disposed on the underside of the water-cooling fin 90. Therefore, the water-cooling fin 90 can effectively dissipate the heat generated by the smoothing capacitor 92 to enhance the reliability of the power module.

A ceramic capacitor having good charging and discharging properties may be used as the smoothing capacitor in the first to eleventh preferred embodiment, to achieve the increase in operating speed of the power module.

While the invention has been described in detail, the foregoing description is in all aspects illustrative and not restrictive. It is understood that numerous other modifications and variations can be devised without departing from the scope of the invention.

What is claimed is:

1. A power module comprising:
   a substrate with a power semiconductor device mounted thereon;
   a case having an interior in which said substrate is disposed;
   a cooling fin having a surface on which said substrate and said case are placed; and
   a smoothing capacitor disposed on an opposite surface of said cooling fin from said surface on which said substrate is placed, said smoothing capacitor being electrically connected to said power semiconductor device for smoothing a voltage to be externally supplied to said power semiconductor device.

2. The power module according to claim 1, wherein said smoothing capacitor is a ceramic capacitor.

* * * * *